US009664714B2

(12) United States Patent
Chen et al.

(10) Patent No.: US 9,664,714 B2
(45) Date of Patent: May 30, 2017

(54) METHODS AND DEVICES FOR DETECTING THE INPUT VOLTAGE AND DISCHARGING THE RESIDUEVOLTAGE

(71) Applicant: Alpha and Omega Semiconductor (Cayman) Ltd., Sunnyvale, CA (US)

(72) Inventors: Yu-Ming Chen, Hsinchu (TW); Chih-Yuan Liu, Zhubei (TW); Pei-Lun Huang, Zhubei (TW)

(73) Assignee: Alpha & Omega Semiconductor (Cayman), Ltd., Sunnyvale, CA (US)

( * ) Notice: Subject to any disclaimer, the term of this patent is extended or adjusted under 35 U.S.C. 154(b) by 244 days.

(21) Appl. No.: 14/670,918

(22) Filed: Mar. 27, 2015

(65) Prior Publication Data

US 2016/0164428 A1 Jun. 9, 2016

(30) Foreign Application Priority Data

Dec. 3, 2014 (CN) .......................... 2014 1 0728910

(51) Int. Cl.
  *G01R 19/00* (2006.01)
  *G01R 19/22* (2006.01)
  *H02M 7/04* (2006.01)
  *H02M 1/32* (2007.01)

(52) U.S. Cl.
  CPC ......... *G01R 19/22* (2013.01); *G01R 19/0007* (2013.01); *H02M 1/32* (2013.01); *H02M 2001/322* (2013.01)

(58) Field of Classification Search
  None
  See application file for complete search history.

(56) References Cited

U.S. PATENT DOCUMENTS

| | | | |
|---|---|---|---|
| 6,862,194 B2 | 3/2005 | Yang et al. |
| 6,940,320 B2 | 9/2005 | Sukup et al. |
| 7,265,999 B2 | 9/2007 | Murata et al. |
| 8,213,192 B2 | 7/2012 | Konecny et al. |
| 8,508,960 B2 | 8/2013 | Chen et al. |
| 2004/0155639 A1 | 8/2004 | Mobers |
| 2009/0040796 A1 | 2/2009 | Lalithambika et al. |
| 2009/0141523 A1 | 6/2009 | Sugawara |
| 2011/0069420 A1 | 3/2011 | Chiu et al. |
| 2011/0216559 A1 | 9/2011 | Ng et al. |
| 2012/0274299 A1 | 11/2012 | Chang et al. |
| 2013/0057323 A1 | 3/2013 | Spini et al. |
| 2013/0223108 A1 | 8/2013 | Xu |

FOREIGN PATENT DOCUMENTS

| | | |
|---|---|---|
| CN | 201450456 U | 5/2010 |
| CN | 103986336 A | 8/2014 |
| CN | 203840204 U | 9/2014 |
| TW | I437238 B | 5/2014 |

*Primary Examiner* — Jared Fureman
*Assistant Examiner* — Aqeel Bukhari
(74) *Attorney, Agent, or Firm* — Lance A. Li; Chein-Hwa Tsao; 5Suns

(57) ABSTRACT

The present invention relates to power conversion systems, specifically, it relates to a device for detecting the DC voltage rectified from the AC power supply voltage in an AC-DC converter, primarily used to determine whether the DC input voltage is under a brown-out level and to monitor whether the AC power supply is removed and to discharge the residue DC voltage generated in a high frequency filter capacitor, which is used to filter high frequency noise signals of the AC power supply, during the removal of the AC power.

46 Claims, 8 Drawing Sheets

METHODS AND DEVICES FOR DETECTING THE INPUT VOLTAGE AND DISCHARGING THE RESIDUEVOLTAGE

PRIORITY CLAIM

This application claims the priority benefit of a Chinese patent application number 201410728910.1 filed Dec. 3, 2014 by a common inventor of this Application. The entire Disclosure made in the Chinese patent application number 201410728910.1 is hereby incorporated by reference.

FIELD OF PRESENT INVENTION

The present invention relates to power conversion systems, specifically, it relates to a device for detecting the DC voltage rectified from the AC power supply voltage in an AC-DC converter, primarily used to determine whether the DC input voltage is under a brown-out state and to monitor whether the AC power supply is removed and to discharge the residue DC voltage generated in a high frequency filter capacitor, which is used to filter high frequency noise signals of the AC power supply, during the removal of the AC power.

BACKGROUND OF RELATED ART

In the conventional power conversion system, AC-DC converters are used to convert the AC input voltage $V_{AC}$ supplied by the grid power into a desired DC voltage $V_{DC}$, and after the voltage converter modulated the voltage $V_{DC}$, producing the final DC output voltage $V_{OUT}$ with small ripple. The conventional technique employed by the AC-DC conversion systems of prior art faces a problem is that the peak value or the effective value, which is also called the root mean square (RMS) value, of the AC input voltage $V_{AC}$ is not constant at all times. When the AC input voltage $V_{AC}$ from the mains electricity is in under voltage or over voltage condition, such as shown in FIG. 1 when the DC voltage V in the period $T_0$ falls below the minimum power supply voltage, for example, usually resulting in flickering or dimming of the display, which may cause damage to the AC-DC converter. Thus real-time monitoring and determination of the trend of the AC input voltage $V_{AC}$ is essential.

In U.S. Patent Application US20090141523, two series resistors are used to form a voltage divider and the detection voltage which reflects the changes in the input voltage $V_{AC}$ is generated at the common node between the two resistors. The two resistors are connected in series between the DC output $V_M$ of the AC input voltage $V_{AC}$ power supply and the ground, which is well known in the art, and are turned on thus generating a current flowing through the two resistors, as a result, the resistors consume power, even though the two resistors merely serve as auxiliary detection components. In view of this, the requirement of a device that can effectively detect changes in input voltage $V_{AC}$, accurately reflects the trends of voltage $V_{AC}$, but at the same time able to avoid unnecessary excessive power consumption is a big challenge.

Furthermore, in order to filter out high frequency noise originated from the AC voltage, existing technology often employs connecting a high frequency filter capacitor $C_X$ to the input terminal of the power conversion device that supplies AC voltage. This implementation introduces negative impact as well. When the AC power is removed, the high frequency filter capacitor $C_X$ will retain a residue DC voltage that equals to the AC voltage at the instance of removal. Unfortunately, if the AC power is removed at the peak of the AC voltage, the residue DC voltage equals the maximum AC voltage, which can easily cause a risk of an electric shock. The conventional method for discharging the residue voltage is using a bleeding resistor $R_B$ connecting in parallel to the high-frequency filter capacitor $C_X$. However the use of the bleeding resistor $R_B$ would result in power loss, which can be calculated by:

$$P = (V_{IN\_RMS})^2 / R_B,$$

where $V_{IN\_RMS}$ is the effective value or the root mean square value of the AC power.

The power loss resulted from bleeding resistor $R_B$ is a serious matter for AC-DC converter, especially under no-load or standby condition. Hence it is a challenge to determine the instance to remove the AC power and to discharge the residue voltage without increasing power loss.

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention.

DESCRIPTION OF THE SPECIFIC EMBODIMENTS

Figure 1:
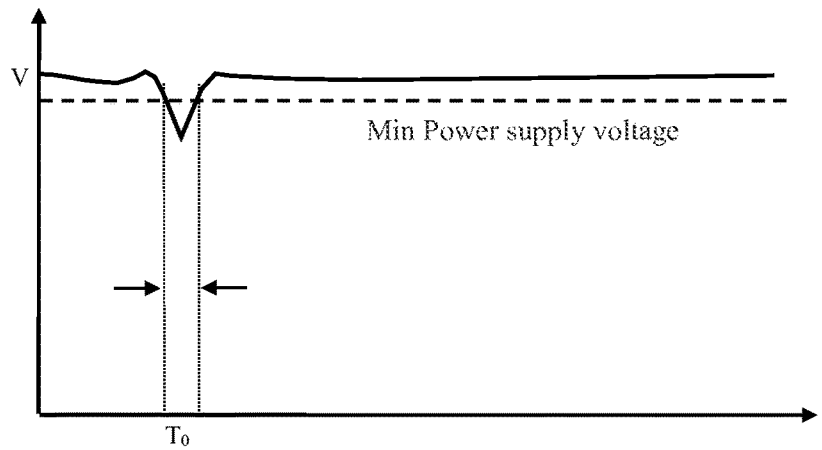
FIG. 1 is a graph showing the actual voltage falling below the minimum required supply voltage during period $T_0$.
Figure 2:
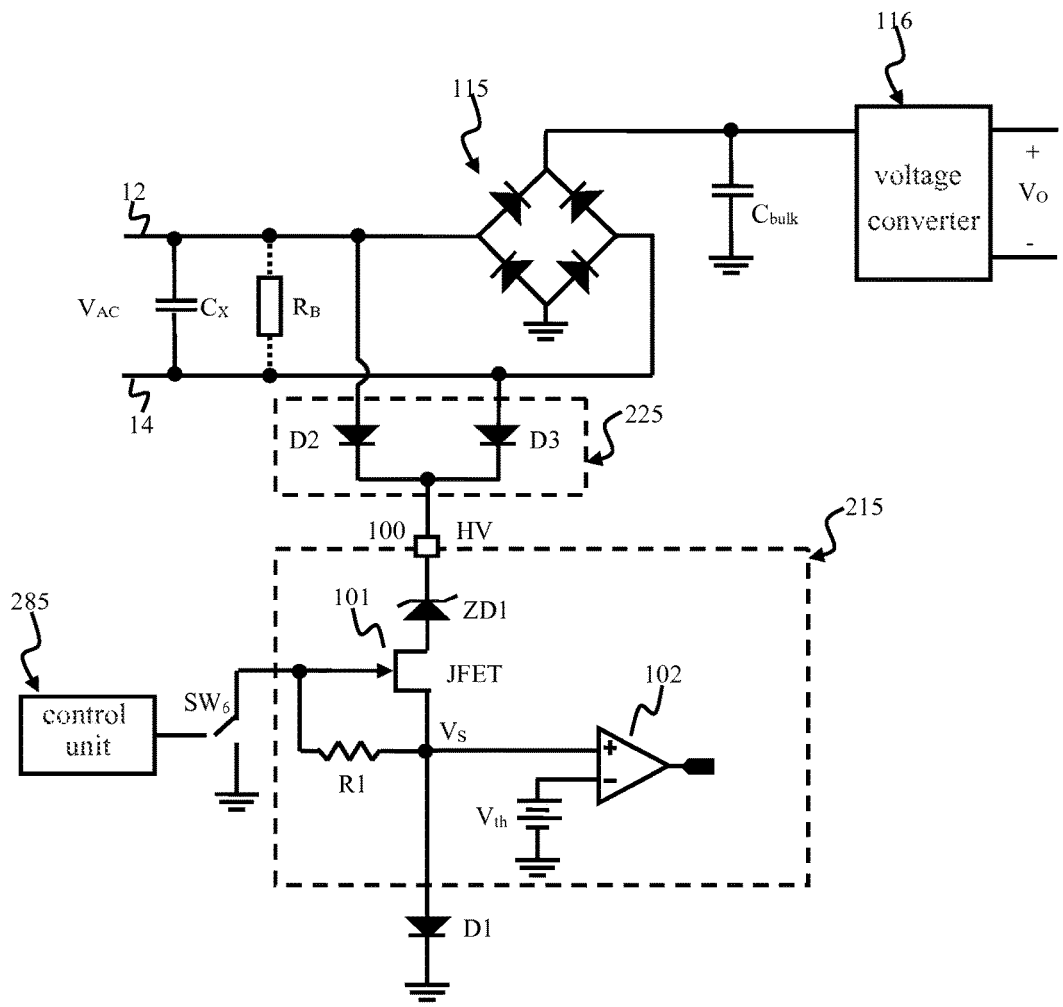
FIG. 2 is a circuit diagram showing the AC voltage $V_{AC}$ is rectified generating an input voltage $V_{IN}$ which is then transmitted to the detection unit.

Referring to FIG. 2, a basic detection unit 215 mainly comprises a junction field effect transistor (JFET) 101 and a Zener diode ZD1, where the anode of the Zener diode ZD1 is connected to the drain of the JFET 101, and the source of JFET 101 is connected to the anode of a diode D1, while the cathode of diode D1 is connected to the ground. In addition, an electronic switch $SW_6$, which is a main switch, is connected between the control terminal, such as the gate of JFET 101 and the ground. Switch $SW_6$ is a three port device having a control terminal coupled to a logic control unit 285 with one end connected to the gate of JFET 101 and the other end connected directly to the ground. When the switch $SW_6$ is on or off, the control unit 285 determines whether the gate of JFET 101 is connected to the ground potential. A resistor R1 is connected between the gate and source of JFET 101. An input DC voltage $V_{IN}$ is fed to the detection unit 215 at node 100 connected to the cathode of the Zener diode ZD1. The input voltage $V_{IN}$ is typically obtained by full-wave rectification of the AC voltage $V_{AC}$, in which the complete sine wave of the input AC power is converted into the output waveform of the same polarity, taking full advantage of the positive half cycle and the negative half cycle of the original sine wave of the AC voltage converting it into a DC voltage $V_{IN}$.

As shown in FIG. 2, the AC voltage $V_{AC}$ supplied by the grid electricity, after the high frequency noise signal is filtered by a high-frequency filter capacitor $C_X$, is rectified through a bridge rectifier 115 and produces an expected DC voltage on an output capacitor $C_{bulk}$. The DC voltage stored in capacitor $C_{bulk}$ is further modulated by a voltage converter 116, either boost modulation or buck modulation, generating the final DC output voltage $V_O$ with a small ripple. This is the conventional technique used by AC-DC conversion system. In the present invention, a bleeding resistor $R_B$ connected (with dashed lines) in parallel with the high-frequency filter capacitor $C_X$ is removed, and the residue DC voltage in the high-frequency filter capacitor voltage $C_X$ will be discharged during the removal of the AC voltage source $V_{AC}$ will be described later without using a bleeding resistor $R_B$ in a preferred embodiment of the present invention.

Referring to FIG. 2, the rectifier circuit 225 has two rectifier diodes D2 and D3. The input terminal 12 for supplying the AC voltage $V_{AC}$ is connected to the anode of diode D2 and to one end of the high-frequency filter capacitor $C_X$, while the other input terminal 14 is connected to the anode of diode D3 and to the opposite end of the high frequency filter capacitor $C_X$. The cathodes of rectifier diodes D2, D3 and the cathode of the Zener diode ZD1 are connected at node 100. Thus the AC voltage $V_{AC}$ supplied by the grid electricity is delivered to AC-DC conversion system and the rectifier circuit 225 at the same time. After the AC voltage $V_{AC}$ is rectified in the rectifier circuit 225, the DC input voltage $V_{IN}$ is produced at the cathode of diode D2, D3, and input to the detecting unit 215 at node 100. The waveform of the input voltage $V_{IN}$, a consecutive positive half cycle sine wave, can be found in FIG. 3B.

Figure 3A:
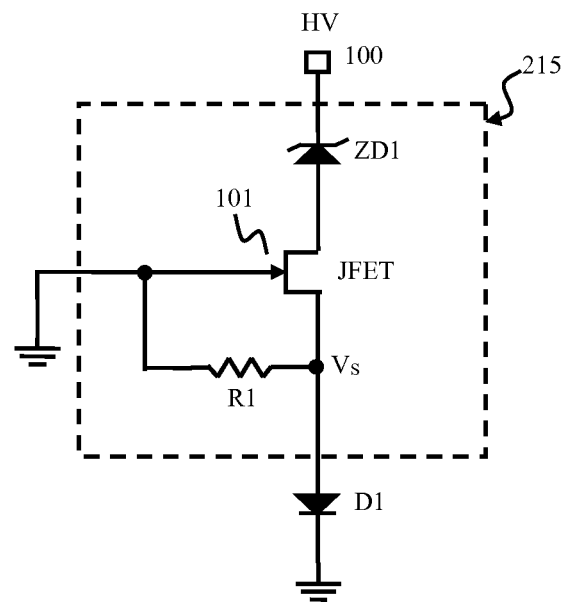
FIG. 3A is a circuit diagram showing the detection signals $V_S$ is captured from the source electrode of a JFET of the detection unit.
Figure 3B:
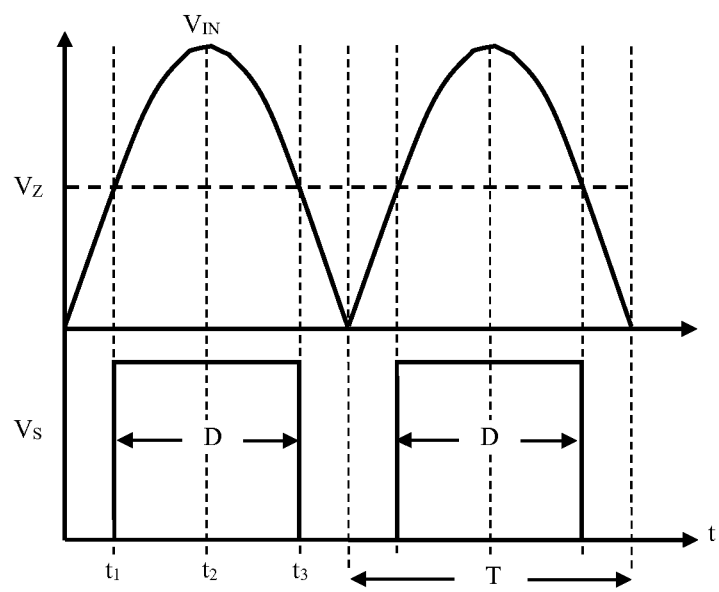
FIG. 3B is output waveform of the detection unit when the input voltage $V_{IN}$ exceeds Zener breakdown voltage.

With reference to FIG. 3A, the gate of JFET 101 is directly connected to the ground. When the input voltage $V_{IN}$ is larger than the breakdown voltage $V_Z$ of the Zener diode ZD1, the Zener diode ZD1 may resume Zener breakdown, resulting in current $I_D$ flowing from the source to the drain of JFET 101, then through the resistor R1 and the diode D1. When the input voltage $V_{IN}$ is less than the Zener breakdown voltage $V_Z$, i.e., the breakdown does not occur in the Zener diode ZD1, hence there is no current flowing through the JFET 101. Referring to FIG. 3B, the breakdown of the Zener diode ZD1, when the input voltage $V_{IN}$ is greater than the breakdown voltage $V_Z$, occurs between time t1 to t3. For example, in a cycle T, the input voltage $V_{IN}$ is increasing and exceeds the Zener breakdown voltage $V_Z$ at time t1 and continuing to increase and get a peak value at time t2, then the input voltage $V_{IN}$ is decreasing and still being greater than the breakdown voltage $V_Z$, and after time t3 the input voltage $V_{IN}$ is decreasing and drops below the breakdown voltage $V_Z$. In the period from t1 to t3, a non-zero voltage $V_S$ is resulted in the source terminal of JFET 101, marking the actual output at the source terminal of JFET 101 at a high logic level, which means the output voltage $V_S$ of the detection unit 215 is at high logic level, which is considered as a first state. In the same cycle T, at a time before t1 and after t3, breakdown does not occur in Zener diode ZD1 since the input voltage $V_{IN}$ is less than the breakdown voltage $V_Z$, as such a zero voltage $V_S$ is resulted at the source terminal of JFET 101, marking the actual output at the source terminal of JFET 101 at a low logic level, i.e., the output voltage $V_S$ of the detecting unit 215 is at low logic level, which is considered as a second state.

Using the method of duty cycle, FIG. 3B illustrates the logic state of the detection voltage $V_S$ and reflects whether breakdown of the Zener diode ZD1 occurs. As shown in FIG. 3B, when the input voltage $V_{IN}$ reaches the peak value at time $t_2$, the duration from time $t_1$ to time $t_3$ equals $2(t_2-t_1)$, hence within cycle T, the total duration of the detection voltage being at the first state is $2(t_2-t_1)$, thus the duty ratio D of the detection voltage $V_S$ in the first state can also be interpreted as the period ratio of the Zener diode ZD1 in breakdown situation.

Setting a safety voltage for the residue voltage as $V_{BRR\_DC}$, the input voltage $V_{IN}$ having an effective value or a root mean square value during low voltage condition (brown-out) as $V_{BO\_RMS}$, and the duty cycle of the detection signal $V_S$ in the first state during brown-out as $D_{BO}$; and the input voltage $V_{IN}$ having an effective value or a root mean square value during start up (brown-in) as $V_{BI\_RMS}$, the duty cycle of the detection signal $V_S$ in the first state during brown-in as $D_{BI}$, when the input voltage $V_{IN}$ is greater than the safety voltage $V_{BRR\_DC}$, the duty cycle $D_{BRR}$ of the detection voltage $V_S$ in the first state satisfies the following function:

$$D_{BRR} = \frac{t_2 - t_1}{t_2} = 1 - \frac{t_1}{t_2} \tag{1}$$

The instantaneous value of the input voltage $V_{IN}$ in a low voltage condition at time $t_1$, $V_{IN}(t_1)$, the effective voltage of the input voltage $V_{IN}$, $V_{BO\_RMS}$, the safety voltage $V_{BRR\_DC}$ satisfy the following function:

$$V_{IN}(t_1)=\sqrt{2}V_{BO\_RMS}\cdot\sin(\omega t_1)=V_{BRR\_DC} \tag{2}$$

The instantaneous value of the input voltage $V_{IN}$ at time $t_2$, $V_{IN}(t_2)$, the effective voltage of the input voltage $V_{IN}$, $V_{BO\_RMS}$ also satisfy the following function:

$$V_{IN}(t_2)=\sqrt{2}V_{BO\_RMS}\cdot\sin(\omega t_2)=\sqrt{2}V_{BO\_RMS} \tag{3}$$

From the phase relationship between sine value, $\omega t_1$ and $\omega t_2$ satisfy the following function:

$$\omega t_1 = \sin^{-1}\left(\frac{V_{BRR\_DC}}{\sqrt{2}V_{BO\_RMS}}\right) \tag{4}$$

$$\omega t_2 = 90° \tag{5}$$

Dividing Equation (4) by (5) and substituting the result into equation (1), to yield:

$$\frac{t_1}{t_2} = \frac{\sin^{-1}\left(\frac{V_{BRR\_DC}}{\sqrt{2}\,V_{BO\_RMS}}\right)}{90°} = 1 - D_{BRR} \quad (6)$$

Rewriting Equation (6) to obtain:

$$\frac{V_{BRR\_DC}}{V_{BO\_RMS}} = \sqrt{2}\sin[90°(1 - D_{BRR})] \quad (7)$$

Similarly, according to the above calculation procedure, the following can be inferred during brown-out and brown-in respectively:

$$\frac{V_{BRR\_DC}}{V_{BO\_RMS}} = \sqrt{2}\sin[90°(1 - D_{BO})] \quad (8)$$

$$\frac{V_{BRR\_DC}}{V_{BO\_RMS}} = \sqrt{2}\sin[90°(1 - D_{BI})] \quad (9)$$

Rewriting equation (8), (9) to yield:

$$D_{BO} = 1 - \frac{1}{90}\sin^{-1}\left(\frac{V_{BRR\_DC}}{\sqrt{2}\,V_{BO\_RMS}}\right) \quad (10)$$

$$D_{BI} = 1 - \frac{1}{90}\sin^{-1}\left(\frac{V_{BRR\_DC}}{\sqrt{2}\,V_{BI\_RMS}}\right) \quad (11)$$

Figure 4:
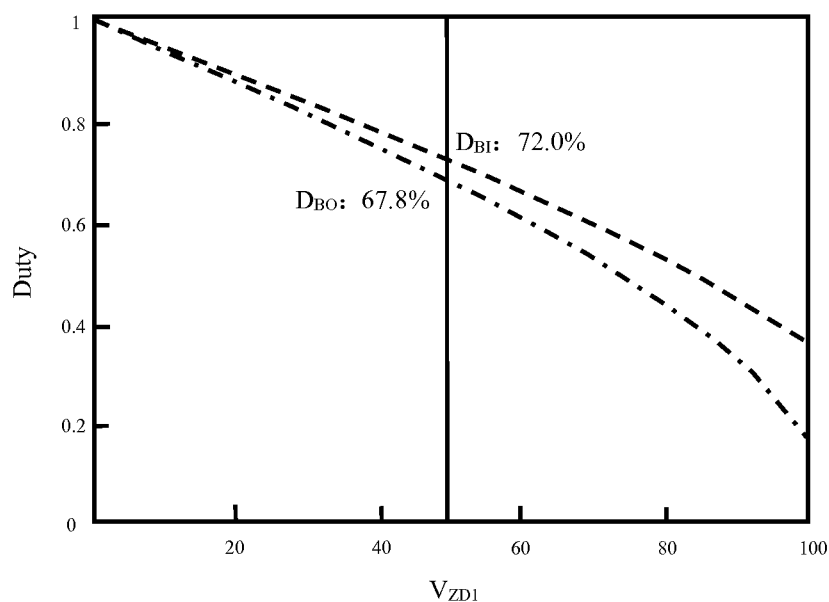
FIG. 4 is a graph illustrating the different duty cycles of the detection signal $V_S$ during low voltage condition and start-up condition at the same Zener breakdown voltage, where low voltage condition is defined as an input voltage at an effective value $V_{BO\_RMS}$ and startup condition is defined as an input voltage at an effective value $V_{BI\_RMS}$.

For illustration, the safety voltage $V_{BRR\_DC}$ can be set at a specific or a multiple of breakdown voltage $VZ_1$ of the Zener diode ZD1, for example the safety voltage $V_{BRR\_DC}$ is 50V. The effective voltage of the input voltage during brown-out is normally less than that during brown-in, for example the input voltage $V_{IN}$ during brown-out $V_{BO\_RMS}$=73VRMS, the input voltage $V_{IN}$ during startup $V_{BI\_RMS}$=83VRMS, the duty cycle of $V_S$ during brown-out (Duty of Brown-out) $D_{BO}$=67.8%, the duty cycle of $V_S$ during startup (Duty of Brown-in) $D_{BI}$=72%, $D_{BO}$ being less than $D_{BI}$, as shown in FIG. 4.

Figure 5:
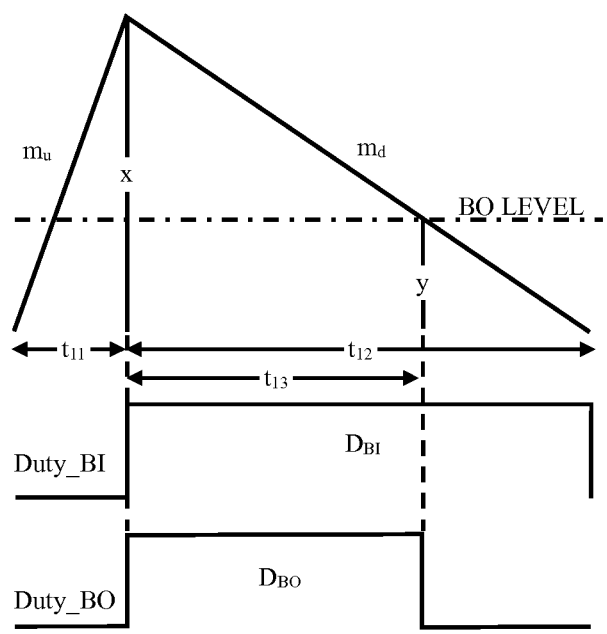
FIG. 5 illustrates the proportion of the maximum voltage achieved by the first and second capacitors $C_T$, $C_L$ at the same time interval.
Figure 6:
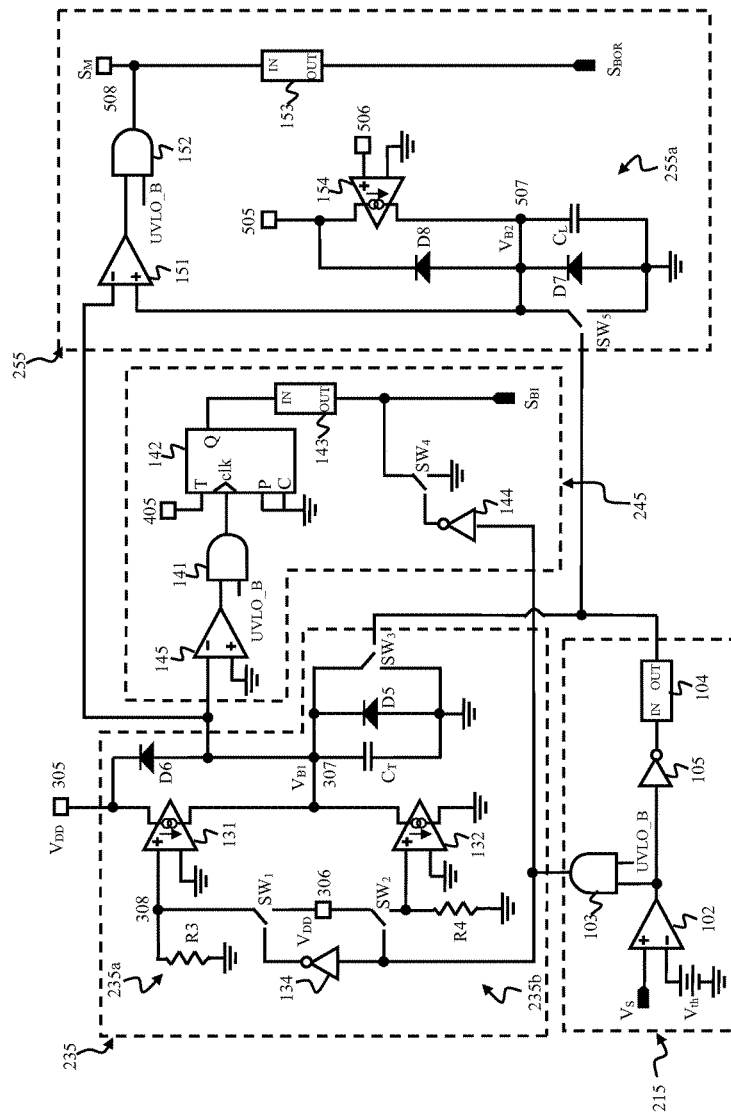
FIGS. 6-8 are circuit diagrams of the alternative power conversion systems used for detecting the input voltage and discharging the residue voltage.

In FIG. 6, a first capacitor $C_T$ of a triangle signal generator 235 and a second capacitor $C_L$ of a reset signal generator 255 are synchronized. As such, the voltage level achieved by the capacitor $C_L$ during a charging phase is associated with the voltage level achieved by the capacitor $C_T$ during the same charging phase, which is used to detect whether the input voltage $V_{IN}$ has entered into brown-out condition. For example, in FIG. 5, after each charging step, the Y value can be used to characterize the maximum voltage value $V_{CLM}$ achieved by the second capacitor $C_L$ during charging step, the X value is used to characterize the maximum voltage value $V_{CTM}$ achieved by the first capacitor $C_T$ during the same charging step, where the ratio between $V_{CLM}$ and $V_{CTM}$ can be set to a predetermined ratio. Based on the detection signal $V_S$ in Brown-in BI and brown-out BO obtained in FIGS. 3A-3B, a model for charging and discharging the capacitor is developed. Referring to FIG. 5, when the input voltage is in normal start-up state, $V_S$ has a duty cycle $D_{BI}$, and during brown-out, $V_S$ has a duty cycle $D_{BO}$. As shown in FIG. 5, during brown-in condition, in the time period $t_{11}$ when $V_S$ is in the second state, an analog capacitor C of the charge and discharge model is being charged; within the time period $t_{12}$ in which $V_S$ is in the first state, the discharge of the capacitor C is completed, and the charge-discharge process of the capacitor C is controlled with the slope of the voltage rising being $m_u$ and the slope of voltage drop being $m_d$. Furthermore, during the brown-out condition, within time period $t_{11}$ when $V_S$ is in the second state, the capacitor C is being charged, and capacitor C maintains the amount of charge it received within time $t_{11}$ while $V_S$ is in the first state in time period $t_{13}$. As a demonstration, in a charge-discharge operation, the charging time period $t_{11}$ in essence may be 2 $t_1$ of FIG. 3B, while $V_S$ being in the first state is $t_1$ to $t_3$ of FIG. 3B. The quantitative analysis of the relevant parameters is as follows:

$$D_{BI} = \frac{t_{12}}{t_{11} + t_{12}} \quad (12)$$

$$D_{BO} = \frac{t_{13}}{t_{11} + t_{13}} \quad (13)$$

From the relationship between the geometry in FIG. 5, it can be noted that:

$$\frac{x}{y} = \frac{t_{12}}{t_{12} - t_{13}} \quad (14)$$

and hence $$t_{12} = \frac{x}{x - y} t_{13}$$

Since $m_u \times t_{11} = m_d \times t_{12}$ and substituting in formula (14), then:

$$\frac{m_u}{m_d} = \frac{x}{x-y} \cdot \frac{t_{13}}{t_{11}}, \quad (15)$$

therefore $$t_{11} = \frac{m_d}{m_u} \cdot \frac{x}{x-y} \cdot t_{13}$$

Substituting the relationship between $t_{11}$ and $t_{13}$ in Equation (15) to formula (13), we obtained:

$$D_{BO} = \frac{t_{13}}{\frac{m_d}{m_u} \cdot \frac{x}{x-y} \cdot t_{13} + t_{13}} = \frac{1}{\frac{m_d}{m_u} \cdot \frac{x}{x-y} + 1} \quad (16)$$

From Equation (16), $$\frac{x}{x-y} = \frac{m_u}{m_d} \cdot \left(\frac{1}{D_{BO}} - 1\right) \quad (17)$$

Further rewriting equation (17):

$$\frac{y}{x} = 1 - \frac{1}{\frac{m_u}{m_d} \cdot \left(\frac{1}{D_{BO}} - 1\right)} \quad (18)$$

Where the slope $m_u$ and the slope $m_d$ of FIG. 5 also satisfy:

$$\frac{m_u}{m_d} = \frac{D_{BI}}{1 - D_{BI}} \quad (19)$$

Substituting Equation (19) into equation (18), $$\frac{y}{x} = 1 - \frac{1}{\left(\frac{D_{BI}}{1-D_{BI}}\right) \cdot \left(\frac{1}{D_{BO}} - 1\right)} \quad (20)$$

Using the results obtained in FIG. 4, the duty cycle of $V_S$ during brown-out $D_{BO}=67.8\%$ and the duty cycle of $V_S$ during startup DBI≈70% and substituting into equation (20) then:

$$\frac{y}{x} = 1 - \frac{1}{\left(\frac{0.7}{1-0.7}\right) \cdot \left(\frac{1}{0.678} - 1\right)} = 0.097 \cong 0.1$$

Hence during the same charging process, the relationship between the maximum voltage $V_{CLM}$ achieved by the second capacitance $C_L$ and the maximum voltage $V_{CTM}$ achieved by the first capacitor $C_T$ can be calculated, and in this example, $V_{CLM}$ is about one tenth of $V_{CTM}$.

Figure 8:
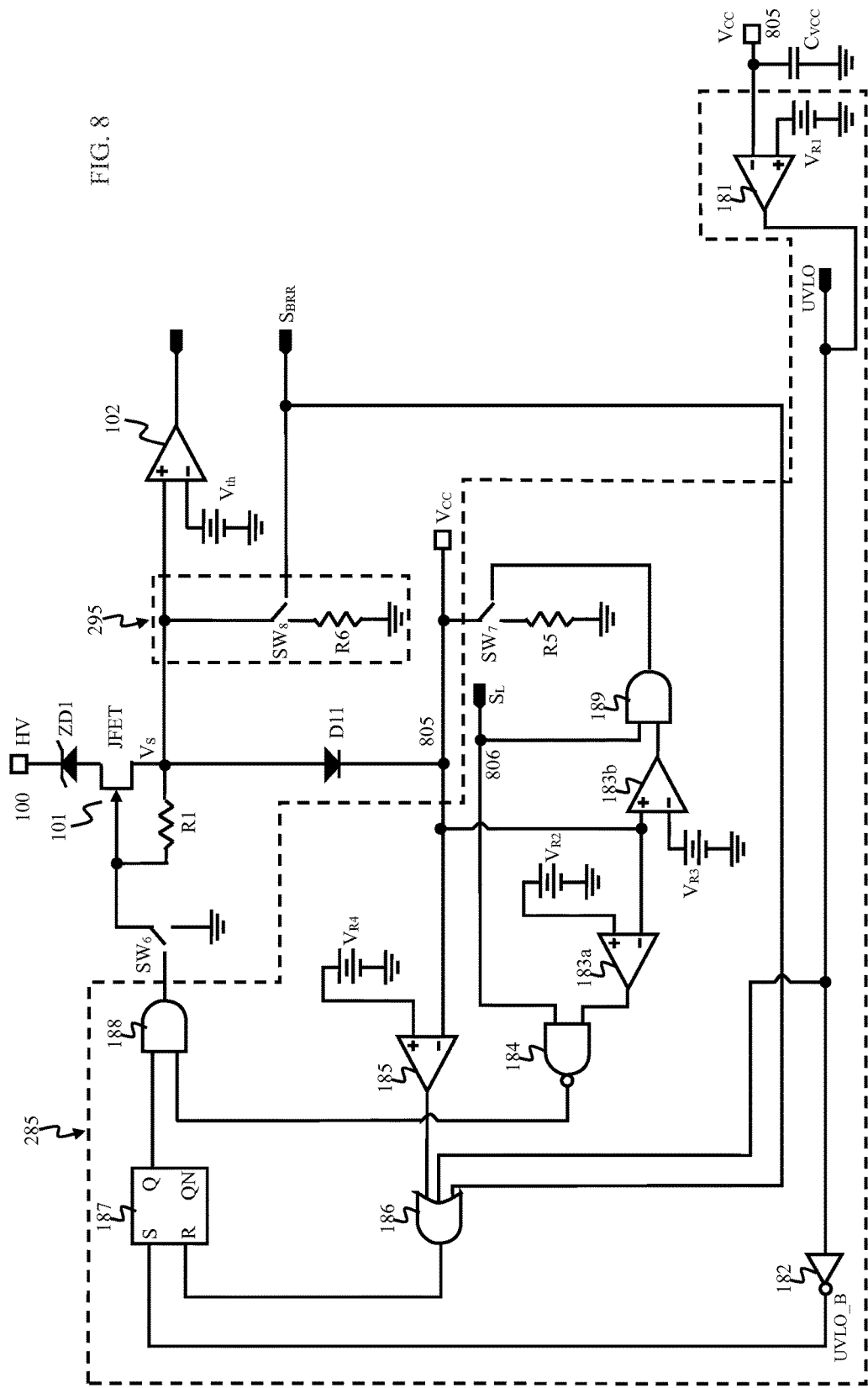

Referring to FIGS. 2, 6 and 8, the device for detecting the input voltage and discharging the residue voltage of the present invention includes a detection unit 215 further including a comparator 102 that transmits a drive signal to turn off or on the switches $SW_1$ to $SW_5$. A threshold voltage $V_{TH}$ (greater than zero) is provided to the inverting input terminal of the comparator 102, and the source of JFET 101 is connected to the non-inverting input terminal of the comparator 102. Although the output drive signal of the comparator 102 can drive the switches directly, but as an option, the drive signal together with an under voltage lockout inverted signal UVLO_B can be supplied simultaneously to two input terminal of the AND gate 103, which is also provided in the detection unit 215. The output of the AND gate 103 is connected to the input of an inverter 134 of a triangle signal generator 235, where the output terminal of the inverter 134 is connected to the control terminal of the switch $SW_1$, while the output of the AND gate 103 is also coupled to the control terminal of the switch $SW_2$, and the AND gate 103 is enabled such that when the under voltage lockout inverting signal UVLO_B is high level, the output of the AND gate 103 is valid, or when the inverting under voltage lockout signal UVLO_B is low level, the drive signal delivered to the switches $SW_1$, $SW_2$ is clamped at the low level and interrupts the charge and discharge cycles of the first capacitor $C_T$ and second capacitor $C_L$.

In addition, detection unit 215 also includes a one shot monostable multivibrator 104. The input of the monostable multivibrator 104 can be connected to the output of the comparator 102, however in the preferred embodiment shown in FIG. 6, the detection unit 215 is further equipped with an inverter 105, if the inverter 105 is enabled, the input terminal of the inverter 105 is connected to the output terminal of the comparator 102 and the output terminal of the inverter 105 is connected to the input terminal of monostable multivibrator device 104, while the output terminal of monostable multivibrator device 104 is connected to the respective control terminal of the switch $SW_3$, $SW_5$. When the drive signal directly triggers the monostable multivibrator device 104, at each falling edge when the detection voltage $V_S$ changes from the first stage to the second state, which is also the falling edge of the output drive signal from the comparator 102, the monostable multivibrator device 104 is triggered to transmit a high level output signal to turn on the switches $SW_3$ and $SW_5$. Since the monostable multivibrator device 104 can be triggered by either at the falling edge or the rising edge, if the inverter 105 is enabled, after the output of the comparator 102 is inverted by the inverter 105, at each falling edge when the detection voltage $V_S$ changes from the first stage to the second state, the rising edge of the inverting drive signal is used to trigger the monostable multivibrator device 104 to transmit an output signal of high level to turn on switch $SW_3$ and $SW_5$ simultaneously.

As mentioned previously, when the input voltage $V_{IN}$ is larger than the breakdown voltage $V_Z$ of the Zener diode ZD1, the breakdown of the Zener diode ZD1 occurs, the voltage generated in detection unit 215 is greater than the preset threshold voltage $V_{TH}$, the comparator 102 generates a high output drive signal, reflecting the first state when the detection voltage signal $V_S$ has a high voltage level. Conversely, when the input voltage $V_{IN}$ is less than the Zener breakdown voltage $V_Z$, the breakdown of the Zener diode ZD1 does not occur, the voltage generated in detection unit 215 is less than the preset threshold voltage $V_{TH}$, the comparator 102 generates a low output drive signal, reflecting the second state when the detection voltage signal $V_S$ has a low voltage level.

With reference to FIG. 6, the device for detecting the input voltage and discharging the residue voltage of the present invention also comprises a triangle signal generator 235 having a first charging current source unit 235a for charging the first capacitor $C_T$ and a first discharge current source unit 235b for discharging the first capacitor $C_T$. After the output drive signal from the comparator 102 is inverted by the inverter 134, it is coupled to the control terminal of switch $SW_1$ in the first charging current source unit 235a, where the on/off state of switch $SW_1$ controls whether the voltage-current converter 131 in the first charging current source unit 235a starts the charging process. Switches $SW_1$ to $SW_5$ in the present invention are three-port switches, for example P-type or N-type MOS transistors or bipolar transistors or junction field effect transistor or a combination thereof, and can be enhance or depletion mode. The output of comparator 102 is also synchronously coupled to the control terminal of switch $SW_2$ in the first discharge current source unit 235b, where the on/off state of switch $SW_2$ controls whether the voltage-current converter 132 in the first discharge current source unit 235b starts the discharging process. The switch $SW_1$ is controlled such that switch $SW_1$ is turned on when the drive signal is at the low level and is turned off when the drive signal is at high level, while the switch $SW_2$ is controlled such that switch $SW_2$ is turned on when the drive signal is at the high level and is turned off when the drive signal is at a low level, i.e., these two switches cannot be turned on or off simultaneously, but alternately turned on.

In the first charging current source unit 235a, a DC supply voltage $V_{DD}$ is applied at node 305 providing the operating voltage for the voltage-current converter 131 and is also applied at another node 306 with switch $SW_1$ and a resistor R3 connected in series between node 306 and the ground. The output terminal of voltage-current converter 131 is connected to a node 307 connecting to the ungrounded end of the capacitor $C_T$, as such voltage current converter 131 receives the power supply voltage $V_{DD}$ and converts it into a charging current of value $I_1$ to charge the first capacitor $C_T$.

The switch $SW_1$ is turned on only when the output voltage of comparator 102 is low; hence the charging current $I_1$ is provided to charge the first capacitor $C_T$ only when the input voltage $V_{IN}$ is lower than the breakdown voltage $V_Z$, i.e. the detection voltage signal $V_S$ is in a logic second state.

In the first discharge current source unit 235b, the switch $SW_2$ and resistors R4 are connected in series between the node 306 and the ground, and the power supply voltage $V_{DD}$ is applied to node 306 providing the operating voltage for the voltage-current converter 132. The input terminal of voltage current converter 132 is connected to the ungrounded end of the first capacitor $C_T$ at the node 307. When the switch $SW_2$ is turned on, the voltage-current converter 132 will receive the power supply voltage and convert it into a discharge current of value $I_2$, therefore when the first capacitor $C_T$ is discharged to the ground, the value of the discharge current is $I_2$. The switch $SW_2$ will be turned on only when the output of comparator 102 is high, i.e., the first capacitor $C_T$ only discharges when the input voltage $V_{IN}$ is larger than the Zener breakdown voltage $V_Z$, or the detection voltage signal $V_S$ is in a high logic level or in the first stage. Thus, the change in state of the detection voltage signal $V_S$ will induce the charge-discharge cycle of the first capacitor $C_T$, and from the changes, for example rise or fall, of the voltage $V_{B1}$ of the first capacitor $C_T$, a periodic sawtooth waveform at node 307 is generated.

With reference to FIG. 6, the device for detecting the input voltage and discharging the residue voltage of the present invention further includes a reset signal generator 255 having a second charging current source unit 255a for charging the second capacitor $C_L$, in which a DC supply voltage $V_{DD}$ is applied at node 505 providing the operating voltage for the voltage current converter 154 in the second charging current source unit 255a. The input terminal 506 of the voltage current converter 154 of the second charging current source unit 255a and the input terminal 308 of the voltage-current converter 131 of the first charging current source unit 235a are coupled together, so that the first capacitor $C_T$ and the second capacitor $C_L$ can be synchronously charged. The power supply voltage $V_{DD}$ is supplied to the voltage-current converter 154 is also controlled by the switch $SW_1$, the output terminal of the voltage current converter 154 is connected to the ungrounded end of the second capacitor $C_L$ at node 507, and the voltage-current converter 154 converts the power supply voltage $V_{DD}$ to a charging current of value $I_3$ charged into the second capacitor $C_L$. Similarly, charging of the second capacitor $C_L$ occurs only when the input voltage $V_{IN}$ is lower than the breakdown voltage VZ, i.e., when the detection voltage signal $V_S$ is in a low logic level or in the second state.

After the synchronous charging and prior to discharging, setting the maximum voltage achieved by the second capacitor $C_L$ to $V_{CLM}$ and the maximum voltage achieved by the first capacitor $C_T$ to $V_{CTM}$, the relationship between $V_{CLM}$ and $V_{CTM}$ can be calculated using $I_3$ and $I_1$ which is the charge current for the second capacitance $C_L$ and the charge current for the first capacitor $C_T$ respectively. For example, taking the ratio of the current conversion efficiency of the second charging current source unit 255a to the current conversion efficiency of the first charging current source unit 235a as y to x (i.e., y/x) (see Equation 20), for a simple calculation, the capacitance of the first capacitor $C_T$ and the second capacitor $C_L$ can be set to substantially the same value.

The triangle signal generator 235 further consists of a switch $SW_3$ connected in parallel with the first capacitor $C_T$. Both the first capacitor $C_T$ and the switch $SW_3$ are connected between the node 307 and the ground. An auxiliary diode D5 is also connected in parallel with the first capacitor $C_T$, where the anode of diode D5 is connected to the ground and the cathode of diode D5 is connected to the node 307. Similarly, the anode of an auxiliary diode D6 is connected to node 307 and the cathode of diode D6 is connected to the node 305. The reset signal generator 255 further consists of a switch $SW_5$ connected in parallel with the second capacitor $C_L$ between the node 507 and the ground, an auxiliary diode D7 connected in parallel with capacitor $C_L$ with the anode of diode D7 connected to the ground and the cathode of diode D7 connected to the node 507, and an auxiliary diode D8 having the anode connected to node 507 and the cathode connected to the node 505. The changes in the logic state of the detection voltage signal $V_S$ will induce the changes of the voltage $V_{B2}$ at node 507 or at the ungrounded end of the second capacitor $C_L$. When the detection voltage signal $V_S$ is in a low level the second capacitor $C_L$ is being charged, and when the detection voltage signal $V_S$ is in a high level the second capacitor $C_L$ maintains the charge, as such at each falling edge, i.e., when the detection voltage signal $V_S$ changes from high level to low level, it triggers the capacitor $C_L$ to be discharged.

During the charge and discharge process of the first capacitor $C_T$ and the second capacitor $C_L$, the discharge cut-off point is set at the falling edge when the detection voltage signal $V_S$ changes from high level to low level, hence regardless of the amount of charges is stored in the first capacitor $C_T$ and the second capacitor $C_L$, an instantaneous discharge process of nanosecond level will be triggered at the cut-off point. To achieve this, the output drive signal from the comparator 102 is transmitted to the control terminal of the switch $SW_3$ and $SW_5$. As shown in FIG. 6, the output of the monostable multivibrator device 104 is connected to the respective control terminal of the switches $SW_3$ and $SW_5$. When the inverter 105 is not enabled, the output of comparator 102 is connected to the input of the monostable multivibrator device 104, however in a preferred embodiment, the inverter 105 is enabled and the input terminal of the inverter 105 is connected to the output terminal of the comparator 102 while the output terminal of the inverter 105 is connected to the input terminal of the monostable multivibrator device 104. At each falling edge, when the detection voltage signal $V_S$ changes from high level to low level, the falling edge triggers the monostable multivibrator device 104 to output a high signal to turn on the switch $SW_3$ and $SW_5$, which can be of nanosecond level, so the first capacitor $C_T$ and the second capacitor $C_L$ are discharged to the ground via switches $SW_3$ and $SW_5$ respectively. When the inverter 105 is enabled, at the falling edge, when the detection voltage signal $V_S$ changes from the high level to the low level, after the drive signal is inverted by inverter 105, each rising edge can be used to trigger the monostable multivibrator device 104 to output high level signal to turn on the switches $SW_3$ and $SW_5$.

Figure 9:
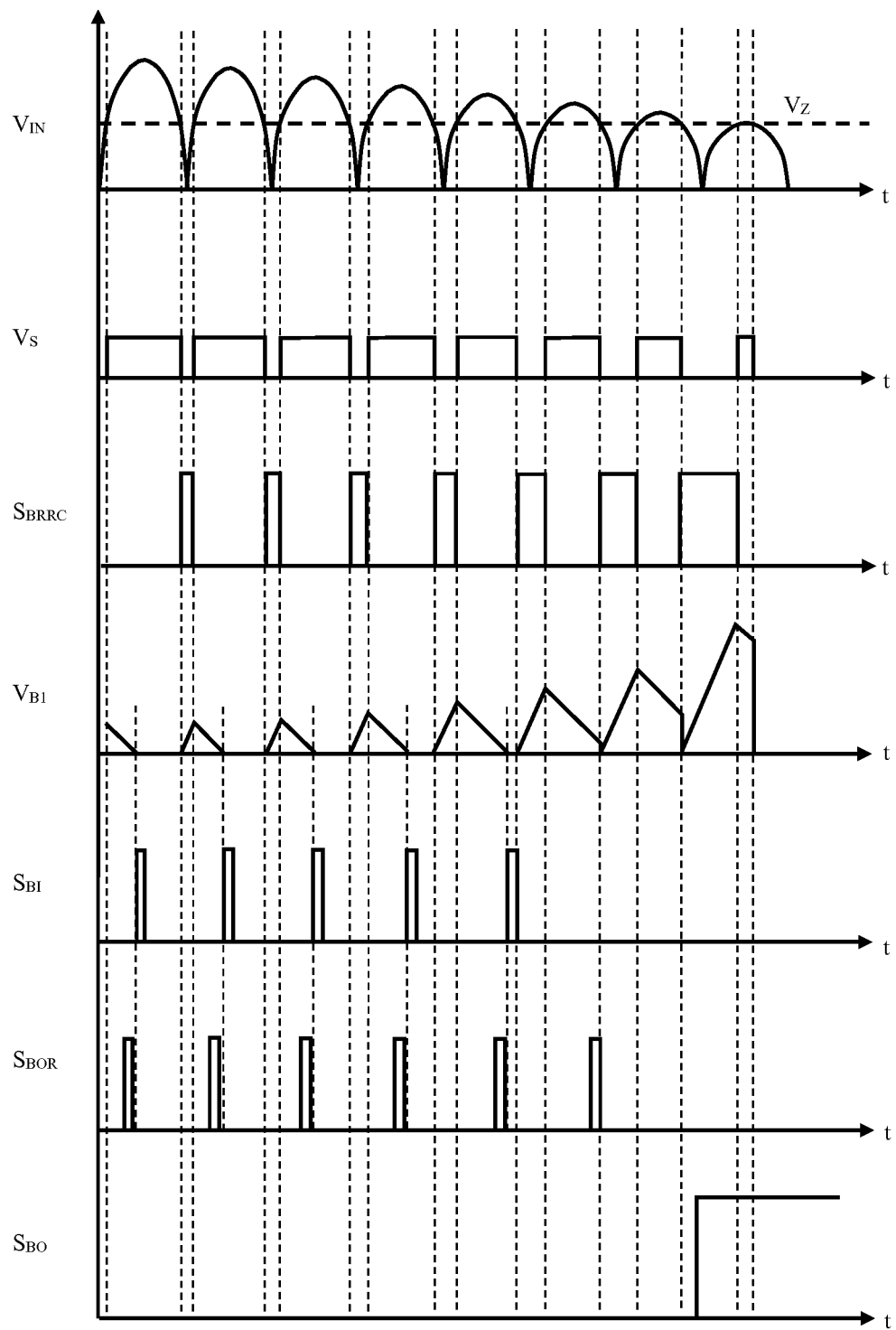
FIG. 9 are waveforms illustrating the changes in detection signal, the voltage of the first capacitor, detection voltage, reset signal, and low voltage detection signal resulted from the gradual decrease of the effective value or the RMS value of the input voltage $V_{IN}$ over time.

Referring to FIG. 9, which displaces the sawtooth waveform $V_{B1}$ generated at node 307, an example of a charge and discharge cycle is illustrated using two adjacent cycle $T_n$ and $T_{n+1}$ (n≥1) of the input voltage $V_{IN}$ when the triangle signal generator 235 is in a stable operation phases. In cycle $T_n$ at the falling edge when the detection voltage signal $V_S$ changes from high level to low level, the first capacitor $C_T$ begins to charge and continues until the rising edge in the cycle $T_{n+1}$ when the detection voltage signal $V_S$ changes from a low level to a high level, then the first capacitor $C_T$ stops charging and begins to discharge immediately, and the discharge process of the first capacitor $C_T$ ends at the cutoff point in cycle $T_{n+1}$ when the detection voltage signal $V_S$ changes from a high level to a low level, thus completing a full charge and discharge cycle.

In other words, the complete charge and discharge cycles of the first capacitor $C_T$ is as follows: the charge cycle starts at the falling edge in a cycle when the detection voltage signal Vs changes from high level to low level and ends at the rising edge in the following cycle when the detection voltage signal $V_S$ changes from the low level to high level, thus the discharge cycle starts and ends at the falling edge in the same cycle when the detection voltage signal $V_S$ changes from a high level to a low level. Meanwhile, the complete charge and discharge cycle of the second capacitor $C_L$ is different from that of the first capacitor $C_T$, which is described as follows: at the falling edge in a cycle when the detection voltage signal $V_S$ changes from high level to low level, the charge cycle starts and at the rising edge in the following cycle when the detection voltage signal $V_S$ changes from the low level to high level, the charge cycle ends and the second capacitor maintain the charge, however the discharge cycle does not start until the falling edge in this same cycle when the detection voltage signal $V_S$ changes from low level to high level.

Referring to FIG. 6, the reset signal generator 255 includes a comparator 151. The ungrounded end of the first capacitor $C_T$ is connected to the inverting input terminal (V−) of comparator 151, while the ungrounded end of the second capacitor $C_L$ is connected to the non-inverting input terminal (V+) of comparator 151, and thus the charging voltage $V_{B1}$ of the first capacitor $C_T$ at node 307 and the charging voltage $V_{B2}$ of the second capacitor $C_L$ at node 507 are compared. The comparison result $S_M$ from the comparator 151 is sent to a monostable multivibrator device 153 in the reset signal generator 255. At the rising edge when the comparison result $S_M$ changes from the second state of low logic level to the first state of high logic level, the monastable multivibrator device 153 is triggered to output a reset signal having a first state $S_{BOR}$. Reset signal generator 255 further includes an AND gate 152. Although the comparison result $S_M$ of the comparator 151 can be fed directly to the monostable multivibrator device 153, as an option, the comparison result $S_M$ and an inverting under voltage lockout signal UVLO_B can be simultaneously fed to the two inputs of the AND gate 152 of the reset signal generator 255. If the AND gate 152 is enabled, the output of AND gate 152 is valid only when the inverting under voltage lockout signal UVLO_B is high, otherwise when inverting under voltage lockout signal UVLO_B is low, the comparison result $S_M$ supplied by the AND gate 152 to the monostable multivibrator device 153 at node 508 is clamped at a low level and will interrupt the monostable multivibrator device 153 generating high logic level reset signal $S_{BOR}$.

The comparison result $S_M$ from the comparator 151 when the AC power supply $V_{AC}$ is removed is different from that when the AC power $V_{AC}$ is going from normal start up mode to a low voltage state, as such the comparison result $S_M$ from the comparator 151 can be used to determine the current status of the AC power supply $V_{AC}$.

Figure 10B:
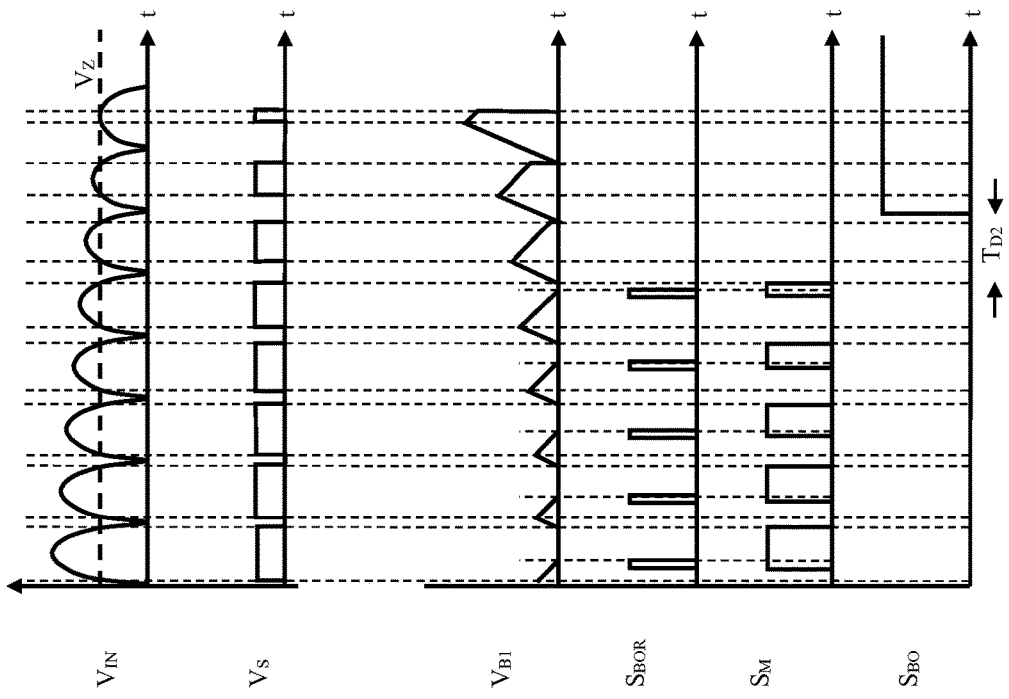
FIGS. 10A-10B are waveforms illustrating the low voltage AC power being removed and the low voltage condition, specifically illustrating whether the device for detecting the input voltage and discharging the residue voltage of the present invention is having an output voltage at low voltage condition or the AC power being removed.
Figure 10A:
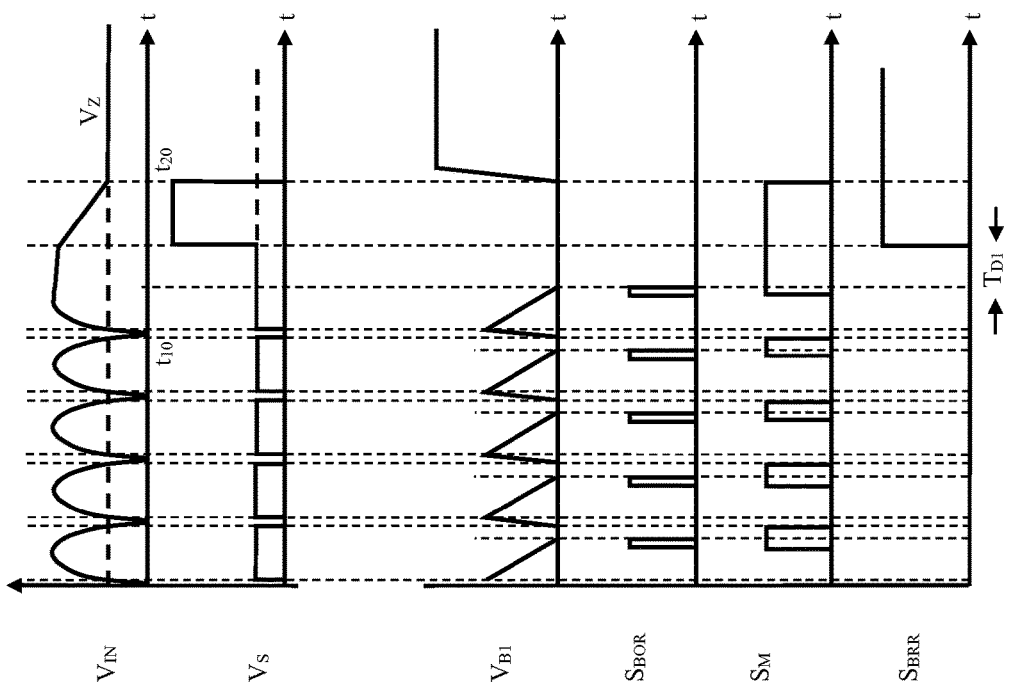

In FIG. 10A, if the AC power $V_{AC}$ is removed, the rectified DC input voltage $V_{IN}$ would exhibit a waveform as shown from time $t_{10}$ to $t_{20}$, which shows the duration when the input DC voltage $V_{IN}$ is greater than the Zener breakdown voltage $V_Z$ may exceed one or more cycles T of the input voltage $V_{IN}$, hence at this stage the duration of the detection voltage signal $V_S$ maintaining at a high level voltage is longer than the duration of the high level voltage of a normal start up cycle. It is also possible that, the voltage level of the detection voltage signal $V_S$ in the first state at a certain time between time $t_{10}$ and $t_{20}$ may be higher than the voltage level of the detection voltage signal $V_S$ in the first state during the normal start up. Within the timeline before time $t_{10}$, in each cycle of the rectified DC input voltage $V_{IN}$ under normal startup, when the detection voltage signal $V_S$ is in the first state, the second capacitor $C_L$ maintains its voltage $V_{B2}$, the voltage $V_{B1}$ of the first capacitor $C_T$ will drop to zero, resulting in a case of voltage $V_{B2}$ greater than the voltage $V_{B1}$, so the comparison result $S_M$ from the comparator 151 will jump from a low level to a high level. Following that the voltage detection signal $V_S$ goes from the high level to the low level, causing the first capacitor $C_T$ and second capacitor $C_L$ to be charged again and thus restoring the state where voltage $V_{B1}$ is greater than voltage $V_{B2}$, thus the duration of the voltage $V_{B2}$ being greater than voltage $V_{B1}$ is extremely short, which means the comparison results $S_M$ from the comparator 151 maintained at a high level is generally within a very short time. However, between time $t_{10}$ to $t_{20}$ during the AC power is being removed, when the detection voltage signal $V_S$ is in the first state, the time taken for the voltage $V_{B1}$ of the first capacitor $C_T$ to drop from the maximum value to zero is basically the same as the start-up state, but only at the time $t_{20}$ when the AC power $V_{AC}$ is completely removed, the input voltage $V_{IN}$ will decrease to less than the Zener breakdown voltage $V_Z$, causing the detection voltage signal $V_S$ to go into the second state having a low level, triggering the second capacitor $C_L$ to discharge, hence the duration of voltage $V_{B2}$ being greater than voltage $V_{B1}$ is longer during the event of the AC voltage $V_{AC}$ removal comparing to start-up or normal operation, as shown by the comparison result $S_M$ waveform in FIG. 10A. The comparison result $S_M$ from the comparator 151 is sent to the monostable multivibrator device 153, and at each turning point of the rising edge when comparison results $S_M$ goes from a low level to a high level, the monostable multivibrator device 153 is triggered to generate a high-level reset signal $S_{BOR}$, when the AC power $V_{AC}$ is being removed, with the wave form of reset signal $S_{BOR}$ shown in FIG. 10A.

In FIG. 10B, when the rectified DC input voltage $V_{IN}$ is not in the brown-out state, in each cycle of the rectified DC input voltage $V_{IN}$ during start up, when the detection voltage signal $V_S$ is in the first state of high level, the second capacitor $C_L$ maintains a constant voltage $V_{B2}$, while the voltage $V_{B1}$ of the first capacitor $C_T$ drops to zero, creating a situation where the voltage $V_{B2}$ is greater than the voltage $V_{B1}$, so the comparison result $S_M$ from the comparator 151 will jump from low level to high level until the detection voltage signal $V_S$ flips from high level to low level causing the capacitors $C_T$ and $C_L$ to be recharged causing the comparison results $S_M$ to flip back to low level. Once the rectified DC input voltage $V_{IN}$ enters the Brown-out state, when the detection voltage $V_S$ is in the first state, the second capacitor $C_L$ maintains constant voltage $V_{B2}$, while the first capacitor $C_T$ is discharged, but the amount of the charge has not been reduced to zero at the moment of falling edge when the detection voltage signal $V_S$ changes from high level to low level. As mentioned above, in order for the voltage value $V_{CLM}$ of the second capacitor $C_L$ and the voltage value $V_{CTM}$ of the first capacitor $C_T$ to satisfy their ratio condition during brown-out, the duty cycle $D_{BI}$ at the falling edge of the detection voltage signal $V_S$ defines that the residue voltage of the first capacitor $C_T$ is not lower than voltage $V_{B2}$ maintained by the second capacitor $C_L$, i.e., during brown-out, in each cycle of the rectified DC input voltage $V_{IN}$, the voltage $V_{B2}$ at node 507 will not be greater than the voltage $V_{B1}$ at node 307, hence the comparison result $S_M$ from the comparator 151 will always be low level, as shown by the comparison result $S_M$ waveform of FIG. 10B. The comparison result $S_M$ from the comparator 151 is fed to the input terminal of the monostable multivibrator device 153, at each turning point of the rising edge when the comparison result $S_M$ changes from low level to high level, the monostable multivibrator device 153 generates a high level reset signal $S_{BOR}$, but if the brown-out state is always lower than the comparison results $S_M$, then the reset signal $S_{BOR}$ will not change to high level, then reset signal $S_{BOR}$ waveform when the input voltage $V_{IN}$ is in brown-out state is as shown in FIG. 10B.

Referring to FIG. 6, the device for detecting the input voltage and discharging the residue voltage of the present invention further includes a startup voltage detection module 245, the voltage $V_{B1}$ of the first capacitor $C_T$ at node 307 is fed to the inverting input of comparator 145 in the startup voltage detection module 245, while the non-inverting input of the comparator 145 is grounded, thus the output detection result of the comparator 145 is transmitted to a monostable multivibrator device 143 in the startup voltage detection module 245. Although the output detection result of the comparator 145 can be directly fed to the monostable multivibrator device 143, as an option, the output detection result and an inverting under voltage lockout signal UVLO_B can be fed simultaneously to the two inputs of an AND gate 141 in the startup voltage detection module 245. If the AND gate 141 is enabled, the output of AND gate 141 is valid only when the inverting under voltage lockout signal UVLO_B is high level. When the inverting under voltage lockout signal UVLO_B is low level, the detection result transmitted to the monostable multivibrator device 143 is clamped at a low level, thus it will interrupt high level start-up voltage detection signal $S_{BI}$ generated by the monostable multivibrator device 143. Optionally the output signal of AND gate 141 can be fed to the CLK input terminal of a T flip-flop 142 of the startup voltage detection module 245. When AND gate 141 is not enabled, the detection result from the comparator 145 can be supplied to the CLK input terminal, where the T port 405 of T flip-flop 142 is connected to a power supply with a high voltage level $V_{DD}$, and Q output of T flip-flop 142 is connected to the input of the monostable multivibrator device 143, as such the T flip-flop is optional and not mandatory.

The interpretation of startup voltage detection signals $S_{BI}$ sent by monostable multivibrator device 143 is described corresponding to FIG. 3B. Following the start-up of the triangle signal generator 235, the switches $SW_1$ and $SW_2$ are alternately turned on, causing the first capacitor $C_T$ to charge and then discharge, hence producing a desired sawtooth voltage signal $V_{B1}$ at node 307 at one end of the first capacitor $C_T$. Presetting a reference input voltage $V_{IN1}$ having a reference RMS value $V_{INR}$, each charging duration of the first capacitor $C_T$ equals to $2t_1$ with the detection voltage signals $V_{S1}$ being in the second state of low logic level. Each discharge duration of the first capacitor $C_T$ equals to $2(t_2-t_1)$, thus the detection voltage signal $V_{S1}$ is in the first state having a high logic level, so the amount of charge in charging duration $2t_1$ is the same as the amount of charge during discharging duration $2(t_2-t_1)$, which means in the following cycle at the falling edge, when the detection voltage signal $V_{S1}$ goes from high level to low level, the discharge of the first capacitor $C_T$ is completed, and the duty ratio of the detection voltage signal $V_{S1}$ is $D_{B1}$, where the amount of charge in the first capacitor $C_T$ at the falling edge of the voltage signal $V_{S1}$ may be zero, and the detection result from the comparator 145 output is in a high level, i.e., the startup voltage detection signal $S_{BI}$ transmitted by the monostable multivibrator 143 has a one-time high value. When the actual detection voltage signal $V_S$ has a duty cycle exceeds the reference $D_{B1}$, which means the effective charging time is shorter and the effective discharging time is longer compared to the reference, then after the first capacitor $C_T$ begins to discharge, at certain moments before each falling edge of the detection voltage signal $V_S$, when the voltage signal $V_{B1}$ is zero, the detection results from the comparator 145 is at high level, in such situation the startup voltage detection signal $S_{BI}$ within each cycle of the input voltage $V_{IN}$ is at high level. In contrast, once the detection voltage signal $V_S$ has a duty ratio smaller than the reference $D_{B1}$, which means the effective charging time is longer and the effective discharging time is shorter compared to the reference state, then after the first capacitor $C_T$ begins to discharge, at every moment of each falling edge of the detection voltage signal $V_S$ the voltage signal $V_{B1}$ will be greater than zero state, the output detection results from the comparator 145 will always be low, thus within every cycle of the input voltage $V_{IN}$ the startup voltage detection signal $S_{BI}$ will be in the low state. On the timeline, the waveform of the startup voltage detection signal $S_{BI}$ produced by the detection voltage signal $V_S$ under different duty cycles as the input voltage $V_{IN}$ gradually decreases in magnitude is as shown in FIG. 9. As time goes on, the magnitude of the input voltage may gradually reduces to below the breakdown voltage $V_Z$ level represented by the dotted line.

The steps of charging and discharging the first capacitor $C_T$ satisfy the following functions:

$$D_B = \frac{t_2 - t_1}{t_2} = 1 - \frac{t_1}{t_2} \tag{21}$$

$$I_1 \times t_1 = I_2 \times (t_2 - t_1) \tag{22}$$

$$\frac{I_1}{I_2} = \frac{t_2 - t_1}{t_1} = \frac{t_2}{t_1} - 1 = \frac{D_B}{1 - D_B} \tag{23}$$

The instantaneous value of input voltage $V_{IN1}$ at time $t_1$, $V_{IN}(t_1)$, the root mean square of the input voltage $V_{IN}$, $V_{INR}$, the breakdown voltage of the Zener diode VD1, $V_{Z1}$, satisfy the following functional relationship:

$$V_{IN}(t_1) = \sqrt{2} V_{INR} \cdot \sin(\omega t_1) = V_{Z1} \tag{24}$$

And the instantaneous value of input voltage $V_{IN1}$ at time $t_2$, $V_{IN}(t_2)$ and the root mean square of the input voltage $V_{IN}$, $V_{INR}$ also satisfy the following functional relationship:

$$V_{IN}(t_2) = \sqrt{2} V_{INR} \cdot \sin(\omega t_2) = \sqrt{2} V_{INR} \tag{25}$$

From the phase relationship of the sine function, it is known that $\omega t_1$ and $\omega t_2$ satisfy the following:

$$\omega t_1 = \sin^{-1}\left(\frac{V_{Z1}}{\sqrt{2} V_{INR}}\right) \tag{26}$$

$$\omega t_2 = 90° \tag{27}$$

Divide Equation (26) by (27) and substituting into equation (21) to obtain:

$$\frac{t_1}{t_2} = \frac{\sin^{-1}\left(\frac{V_{Z1}}{\sqrt{2} V_{INR}}\right)}{90°} = 1 - D_{B1} \tag{28}$$

With reference to FIG. 6, as an option, a switch $SW_4$ can be connected between the output of the monostable multivibrator device 143 and the ground. The control terminal of switch $SW_4$ receives the inverting signal of the drive signal produced by the comparator 102 in the detection unit 215, specifically the output of comparator 102 or the output of the AND gate 103 of the detection unit 215 may be connected to an input of inverter 144 in the startup voltage detection module 245, and the output terminal of inverter 144 is connected to the control terminal of switch $SW_4$. When the potential of the detection voltage signal $V_S$ is greater than the threshold voltage $V_{TH}$, after the high drive signal of the comparator 102 is inverted, switch $SW_4$ is turned off, and thus the startup voltage detection signal $S_{BI}$ is triggered only by the monostable multivibrator device 143. When the potential of the detection voltage signal $V_S$ is less than the threshold voltage $V_{TH}$, then after the low drive signal of the comparator 102 is inverted, switch $SW_4$ is turned on, clamping the startup voltage detection signal $S_{BI}$ at ground potential.

Figure 7:
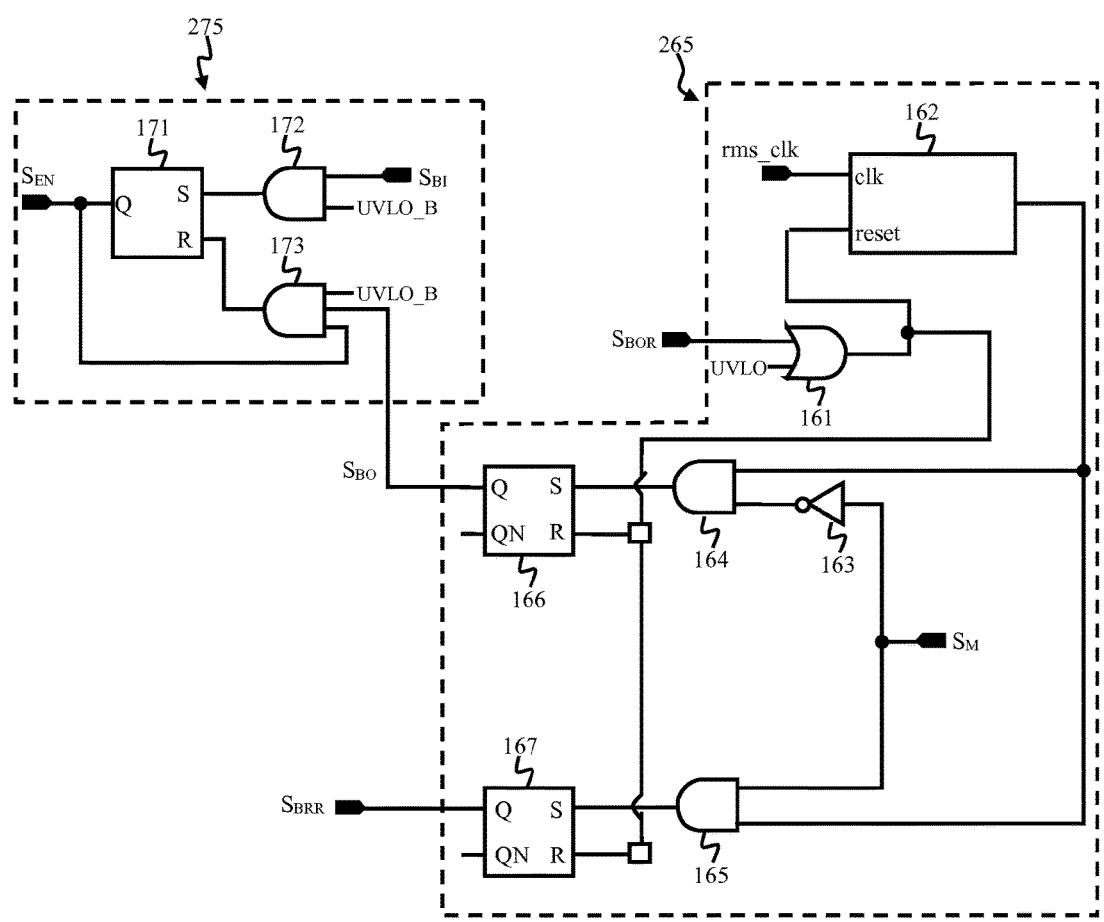

With reference to FIG. 7, the device for detecting the input voltage and to discharge residue voltage of the present invention also includes an AC power removal and brown-out status determination unit 265 that produces a high level brown-out detection signal $S_{BO}$ when the input voltage $V_{IN}$ is at brown-out state or to produces a high level power removal signal $S_{BRR}$ when AC power is removed. The AC power removal and brown-out status determination unit 265 comprises a counter 162, where a reset port of the counter 162 receives a reset signal $S_{BOR}$ sent by a reset signal generator 255, and when the counter 162 does not receives a high level reset signal $S_{BOR}$ within a preset De-bounce time, the counter 162 will be triggered to produce a high output. First, the output of counter 162 is fed to the input terminal of an AND gate 164 of the AC power removal and brown-out status determination unit 265, and after the comparison result $S_M$ from the comparator 151 of the reset signal generator 255 is fed to the inverter 163 in the AC power removal and brown-out status determination unit 265, the inverting comparison signal $S_M$ is input to the other input terminal of the AND gate 164. Then, the output of the counter 162 is also fed to an input terminal of another AND gate 165 in the AC power removal and brown-out status determination unit 265, while the comparison result $S_M$ from the comparator 151 of the reset signal generator 255 is fed directly to the other input terminal of the AND gate 165. Although the reset signal $S_{BOR}$ can be fed directly to the counter 162, as an option, the reset signal $S_{BOR}$ and an under voltage lockout signal UVLO are delivered simultaneously to the two inputs of an OR gate 161 in the AC power removal and brown-out status determination unit 265. If the OR gate 161 is enabled, only when the under voltage lockout UVLO signal is low, the output of OR gate 161 will be effective, otherwise when the under voltage lockout UVLO signal is high, the input of counter 162 will be clamped at high, which will control the output of the counter 162 so that high level will no longer occurs.

Referring to FIG. 7, the AC power removal and brown-out status determination unit 265 further includes a first RS flip-flop 166 and a second RS flip-flop 167, where the output of AND gate 164 is connected to the set terminal S of the first RS flip-flop 166 and the output of the AND gate 165 is connected to the set terminal S of the second RS flip-flop 167. The reset signal $S_{BOR}$ or the output signal of the OR gate 161 is supplied to the reset terminal R of the first RS flip-flop 166 and that of the second RS flip-flop 167. Referring to FIG. 10B, in brown-out state, within each cycle of the input voltage $V_{IN}$ the situation of voltage $V_{B2}$ at node 507 being greater than voltage $V_{B1}$ at node 307 will not occur, hence the comparison result $S_M$ from the comparator 151 will always be low, resulting in a reset signal $S_{BOR}$ that wont jump to high level. Starting from any moment when the reset signal $S_{BOR}$ is high level, if the counter 162 does not receive any high level reset signal $S_{BOR}$ within a preset period $T_{D2}$, the output of the counter 162 will change from low level to high level. At such time the comparison result $S_M$ is low level so the inverting signal is high level, hence value at the set terminal S of the first RS flip-flop 166 and the control of the AND gate 164 is at high level, while the reset terminal R of the first RS flip-flop 166 is in a low state as determined by the low reset signal $S_{BOR}$, thus the brown-out detection signal $S_{BO}$ from the output terminal Q of the first flip-flop 166 jumps from low level to high level, producing a characteristic high brown-out detection signal $S_{BO}$ when the input voltage is in brown-out state. On the contrary, in brown-out state, the low level comparison result $S_M$ will result in the AND gate 165 not generating a high level output signal, so brown-out will clamp the set terminal S of the second RS flip-flop 167 at the low level, and its Q output is also low level.

Referring to FIG. 10A, at the power removal from time $t_{10}$ to $t_{20}$, after the voltage $V_{B1}$ drops from the maximum value to below voltage $V_{B2}$, the duration of voltage $V_{B2}$ higher than the voltage $V_{B1}$ is longer compared to startup or normal operation, hence the duration when the comparison result $S_M$ from comparator 151 generates a high level is longer. At time $t_{20}$ after the AC power supply $V_{AC}$ was completely removed, the charging voltage $V_{B2}$ in second capacitor $C_L$ is less than the first charging voltage $V_{B1}$ in the first capacitor $C_T$, causing the comparison result $S_M$ from comparator 151 to be low level. When the reset signal $S_{BOR}$ is high level, if the counter 162 does not receive any high level reset signal $S_{BOR}$ within a preset period $T_{D1}$, the output of the counter 162 will change from low level to high level. During power removal, the duration of the comparison results $S_M$ maintaining at high level is much longer than the startup and the normal operations, and during this time there is no rising edge to trigger the monostable multivibrator 153, i.e., the reset signal $S_{BOR}$ is also at a low level when the comparison result $S_M$ maintains a high level. Therefore during the removal event, the set terminal S of the second RS flip-flop 167 and the control of AND gate 165 are high level, while the reset terminal R of the second RS flip-flop 167 is in a low state determined by the reset signal $S_{BOR}$, hence the power removal signal $S_{BRR}$ produced at the output terminal Q of the second RS flip-flop 167 jumps from low level to high level, resulting in a high level power removal signal $S_{BRR}$ which characterizes the AC power removal. On the contrary, during power removal, the comparison result $S_M$ will remain high level, the inverting signal will cause the AND gate 164 not to output a high voltage level, so during power removal, the set terminal S of the first RS flip-flop 166 is clamped at low level and the output terminal Q is low level.

Referring to FIG. 7, the device for detecting the input voltage and discharging the residue voltage of the present invention further includes an enable signal generator 275, where the two inputs of an AND gate 172 receive the inverting under voltage lockout signal UVLO_B and the startup voltage detection signal $S_{BI}$ transmitted by the startup voltage detection module 245. The set terminal S of a third RS flip-flop 171 in the enable signal generator 275 is connected to the output of an AND gate 172. The reset terminal R of the third RS flip-flop 171 is connected to the output of another AND gate 173 in the enable signal generator 275, in which the three inputs of AND gate 173 receive the inverting under voltage lockout signal UVLO_B, the original-state signal from output terminal Q of the third RS flip-flop 171, and the brown-out detection signal $S_{BO}$ transmitted by the AC power removal and brown-out status determination unit 265 respectively. After the entire system began to operate, when the start-up voltage detection signal $S_{BI}$ and the inverting under voltage lockout signals UVLO_B are both in the first state of high level, then at this time both of the brown-out detection signal $S_{BO}$ and the initial logic level of output Q of the third RS flip-flop 171 are low level, or at least the later Q output is low level, hence the set terminal S of the third RS flip-flop 171 is controlled at high level by the AND gate 172 and the reset terminal R of the third RS flip-flop 171 is controlled at low level by AND gate 173, which triggers the output terminal Q of the third RS flip-flop 171 to produce a high enable signal EN and initiate the execution of soft-start procedure. When the input voltage enter brown-out state, brown-out detection signal $S_{BO}$, inverting under voltage lockout signal UVLO_B and the enable signal EN will all be in the first state of high level, and at this stage the start-up voltage detection signal $S_{BI}$ in generally is in the second state of low level, and the output of AND gate 172 and of the AND gate 173 will trigger the output terminal Q of the third RS flip-flop 171 to produce a low disable signal.

In some embodiments, the control terminal of JFET 101 may be directly grounded as in FIG. 3A. In an alternative embodiment shown in FIG. 8, the device for detecting the input voltage and discharging residue voltage of the present invention also includes a logic control unit 285 for controlling the main control switch $SW_6$ connected between the control terminal of JFET 101 and the ground in the ON state. When the logic control unit 285 receives a high-level power removal signal $S_{BRR}$ characterizing the AC power removal provided by the AC power removal and brown-out status determination unit 265, it turns off the main switch SW6. The anode of a diode D11 is connected to the source of JFET 101, and the cathode of the diode D11 is connected at node 805 connecting to one end of a power supply capacitor $C_{VCC}$, while the other end of the power supply capacitor $CV_{CC}$ is grounded. When JFET 101 is turned on and when the input voltage exceeds the Zener breakdown voltage $V_Z$, a current will flow through the diode D11 to charge the power supply capacitor $C_{VCC}$, as the diode D11 prevents current backflow, and when JFET 101 is disconnected, the diode D11 blocks the potential from supply capacitor $C_{VCC}$, to prevent the detection voltage signal $V_S$ being clamped by the potential of supply capacitor $C_{VCC}$ and cannot fall to a lower potential such as zero potential. The supply capacitor $C_{VCC}$ may also provide a DC voltage $V_{CC}$ at node 805 connecting to its ungrounded end.

The voltage $V_{CC}$ of the power supply capacitor $C_{VCC}$ is fed to the inverting input terminal of the first voltage detection comparator 181 of the logic control unit 285, while a first reference voltage $V_{R1}$ is fed to the non inverting input terminal of the first voltage detection comparator 181, thus the first voltage detection comparator 181 generates the under voltage lockout signal UVLO that goes through an inverter 182 in the logic control unit 285 generating the inverting under voltage lockout signal UVLO_B. When the power supply capacitor $C_{VCC}$ is not charged or is charged but its voltage $V_{CC}$ does not exceed the first reference voltage $V_{R1}$, the under voltage lockout signal UVLO generated by the first voltage detection comparator 181 is at a high level, and the inverting under voltage lockout signal UVLO_B is at a low level. When the power supply capacitor $C_{VCC}$ is charged and the voltage $V_{CC}$ exceeds the first reference voltage $V_{R1}$, the under voltage lockout signal UVLO generated by the first voltage detection comparator 181 is at a low level, and the inverting under voltage lockout signal UVLO_B at a high level.

The inverting under voltage Lockout signal UVLO_B is fed to the set terminal S of a fourth RS flip-flop 187 in the logic control unit 285, while the reset terminal R of the fourth RS flip-flop 187 is connected to the output of an OR gate 186 in the logic control unit 285. The first input terminal of the OR gate 186 receives the power removal signal $S_{BRR}$ and the second input terminal receives the under voltage lockout signal UVLO generated by the first voltage detection comparator 181. Furthermore, the third input terminal of the OR gate 186 is connected to the output terminal of a fourth voltage detection comparator 185 in the logic control unit 285, where a fourth reference voltage $V_{R4}$ is fed to the non-inverting input terminal of the fourth voltage detection comparator 185 and the inverting input of the fourth voltage detection comparator 185 is coupled with the input voltage $V_{CC}$ from supply capacitor $C_{VCC}$ at node 805, thus the fourth reference voltage $V_{R4}$ can be preset to less than the first reference voltage $V_{R1}$.

During start-up, when the voltage $V_{CC}$ of the power supply capacitor $C_{VCC}$ is lower than the first reference voltage $V_{R1}$, the under voltage lockout signal UVLO is in the first state of high logic level and the power removal signal $S_{BRR}$ is low level, if the fourth voltage detection comparator 185 is enabled, the voltage $V_{CC}$ is also lower than the fourth reference voltage $V_{R4}$, so the output of OR gate 186 is high level, hence the set terminal S and the reset terminal R of the fourth RS flip-flop 187 are at low level and high level respectively; thereby triggering the output terminal Q of the fourth RS flip-flop 187 to produce a low output which turns off the main switch $SW_6$, and begin charging the power supply capacitor $C_{VCC}$ until its voltage $V_{CC}$ is not lower than the first reference voltage $V_{R1}$. If the fourth voltage detection comparator 185 is enable, then the voltage $V_{CC}$ is also not lower than the fourth reference voltage $V_{R4}$, as a result, the under voltage lockout signal UVLO is changed from initial high level to low level.

After the completion of the predetermined charging of power supply capacitor $C_{VCC}$, the under voltage lockout signal UVLO is at a low level, the output of the fourth voltage detection comparator 185 is also at low level, hence the inverting under voltage lockout signal UVLO_B is high, as such in an attempt to maintain the control signal at the output port Q of the fourth RS flip-flop 187 at a high level so the main switch $SW_6$ is turned on, the reset terminal R of the fourth RS flip-flop 187 should be set to the low level. At this time low level power removal signal $S_{BRR}$ satisfies the low level condition, resulting in the OR gate 186 generating a low level signal to the reset terminal R of the fourth RS flip-flop 187. However, during AC power removal, when the power removal signal $S_{BRR}$ is triggered to a high level, it will force the output signal of the OR gate 186 to change to high level, further placing the reset R of the fourth RS flip-flop 187 in a high level, causing the control signal of the output port Q of the fourth RS flip-flop 187 to reset to a low level, thus turning off the main switch $SW_6$.

Although the output port Q of the fourth RS flip-flop 187 may be coupled directly to the control terminal of the main switch $SW_6$, in the alternative embodiment, the output port Q of the fourth RS flip-flop 187 is connected to the input terminal of AND gate 188 while the output terminal of the AND gate 188 is coupled to the control terminal of the main switch $SW_6$ to turn on or turn off the main switch SW6.

Furthermore, the output terminal of a NAND gate 184 in the logic control unit 285 is connected to the other input terminal of the AND gate 188, while the output terminal of the AND gate 188 is coupled to the control terminal of the main switch SW6. The voltage $V_{CC}$ of the power supply capacitor $C_{VCC}$ at node 805 is simultaneously fed to the inverting input terminal of a second voltage detection comparator 183a and the non inverting input terminal of a third voltage detection comparator 183b in the logic control unit 285, and the second reference voltage $V_{R2}$ is applied to the non inverting input terminal of the second voltage detection comparator 183a while a third reference voltage $V_{R3}$ is applied to the non inverting input of the third voltage detection comparator 183b.

The output of the second voltage detection comparator 183a and a latch signal $S_L$ provided at node 806 are fed to the two input terminals of NAND gate 184, while the output of the third voltage detection comparator 183b and the latch signal $S_L$ are fed to two input terminals of another AND gate 189 in the logic control unit 285. The output terminal of the AND gate 189 is connected to a control terminal of the regulating switch SW7, where the regulating switch SW7 and the power supply capacitor $C_{VCC}$ are connected in parallel between node 805 and the ground. The regulating switch SW7 can be connected in series with a resistor R5 between node 805 and the ground, both of which are then connected in parallel with the power supply capacitor $C_{VCC}$ between node 805 and the ground. Prior to the voltage $V_{CC}$ of the power supply capacitor $C_{VCC}$ reaching the second reference voltage $V_{R2}$, the latch signal $S_L$ is set to a low level, and after the voltage $V_{CC}$ of the power supply capacitor $C_{VCC}$ reaches the second reference voltage $V_{R2}$, the latch signal $S_L$ is then set to high level.

The value of the third reference voltage $V_{R3}$ is larger than that of the second reference voltage $V_{R2}$, and when the voltage $V_{CC}$ of the power supply capacitor $C_{VCC}$ exceeds the third reference voltage $V_{R3}$, the output of the AND gate 189, which is connected to the output of the third voltage detection comparator 183b, is high level, thus the regulating switch SW7 is turned on to release a portion of the power of the power supply capacitor $C_{VCC}$ until the voltage $V_{CC}$ of the power supply capacitor $C_{VCC}$ does not exceed the third reference voltage $V_{R3}$. Further, when the voltage $V_{CC}$ of the power supply capacitor $C_{VCC}$ is lower than the second reference voltage $V_{R2}$, the output of NAND gate 184 is at a low level, which causes the output of the AND gate 188, which is connected to the output of NAND gate 184, to be at low level, thus the low output of AND gate 188 will turn off the main switch SW6. Therefore, through this voltage regulation mode, the voltage $V_{CC}$ is confined within the range between the second reference voltage $V_{R2}$ and the third reference voltage $V_{R3}$, but higher than the first reference voltage $V_{R1}$.

Referring to FIG. 8, in an alternative embodiment, the device for detecting the input voltage and discharging the residue voltage of the present invention further includes a discharge branch 295 having a switch SW8 connected between the source of JFET 101 and the ground. Preferably, the switch SW8 is connected in series with a resistor R6 and both of them are connected between the source of JFET 101 and the ground. The power removal signal $S_{BRR}$ is coupled to the control terminal of switch SW8, and in normal operation of the device, the power removal signal $S_{BRR}$ is low level hence the switch SW8 is turned off. However during AC power removal, the AC power removal and brown-out status determination unit 265 is triggered to generate an effective high power removal signal $S_{BRR}$ that will turn on switch SW8, thus the path from node 100 to the source of JFET 101 then through node 295 to the ground, i.e., the discharge branch 295, is a conductive path, as such the discharge branch 295 can further be leveraged to discharge the residue voltage on the high-frequency filter capacitor voltage $C_X$ until the residue voltage is lower than the Zener breakdown voltage $V_Z$.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A device for detecting input voltages and discharging residue voltages, comprising:
   a detection unit receiving a rectified DC input voltage, and according to fluctuations of the input voltage, generating a detection voltage signal having different logic levels;
   a triangle signal generator having a first capacitor, wherein in any one cycle of the input voltage at a moment the detection voltage signal changes from a first state to a second state, the first capacitor begins to charge, and in a following consecutive cycle of said any one cycle at a moment the detection voltage signal changes from the second state to the first state, the first capacitor begins to discharge;
   a reset signal generator having a second capacitor, wherein the second capacitor charges synchronously with the first capacitor and begins to discharge in the following consecutive cycle at a moment the detection voltage signal changes from the first state to the second state g, wherein the reset signal generator compares a varying voltage of the first capacitor and a varying voltage of the second capacitor and according to a comparison result triggers generation of a reset signal;
   an AC power removal and brown-out status determination unit comprising a counter, wherein within a preset period when the counter does not receive a first state reset signal and the voltage of the first capacitor is not lower than the voltage of the second capacitor, the AC power removal and brown-out status determination unit generates a brown-out detection signal indicating the input voltage at brown-out status; and when the voltage of the first capacitor is lower than the voltage of the second capacitor within the preset period, the AC power removal and brown-out status determination unit generates a power removal signal indicating the removal of the AC power supply.

2. The device of claim 1, wherein, in the detection unit an anode of a Zener diode is connected to a drain of a junction field effect transistor (JFET), and the input voltage is applied to a cathode of the Zener diode, thereby generating detection voltage signal at a source of the junction field effect transistor.

3. The device of claim 2, wherein when the input voltage exceeds a breakdown voltage of the Zener diode, the detection unit generates the detection voltage signal of the first state having a high logic level, and when the input voltage is lower than the breakdown voltage of the Zener diode, the detection unit generates the detection voltage signal of the second state having a low logic level.

4. The device of claim 2 further comprising:
a rectifier circuit having a high frequency filter capacitor connected across two input terminals of the rectifier circuit, wherein an AC power supplied to the two input terminals is rectified through the rectifier circuit to produce the DC input voltage; and
a discharge branch having a switch connected between the source of the junction field effect transistor and ground; wherein during the AC power removal, a high level power removal signal is produced, which turns on the switch of the discharge branch to discharge the residue voltage of the high-frequency filter capacitor.

5. The device of claim 2, wherein:
during the AC power removal, a residue voltage of the AC power is discharged to a set safety level voltage $V_{BRR\_DC}$;
during brown-out state, an effective value of the input voltage is $V_{BO\_RMS}$ and a duty cycle of the detection voltage signal at the first state is $D_{BO}$;
during startup, the effective value of the input voltage is $V_{BI\_RMS}$ and the duty cycle of the detection voltage signal at the first state is $D_{BI}$; and
after the first and the second capacitors complete charging synchronously for a same period of time, a maximum voltage of the second capacitor is $V_{CLM}$, and a maximum voltage of the first capacitor is $V_{CTM}$ satisfy the equation:

$$\frac{V_{CLM}}{V_{CTM}} = 1 - \frac{1}{\left(\frac{D_{BI}}{1-D_{BI}}\right) \cdot \left(\frac{1}{D_{BO}} - 1\right)};$$

Where $$D_{BO} = 1 - \frac{1}{90}\sin^{-1}\left(\frac{V_{BRR\_DC}}{\sqrt{2}\, V_{BO\_RMS}}\right),$$

and $$D_{BI} = 1 - \frac{1}{90}\sin^{-1}\left(\frac{V_{BRR\_DC}}{\sqrt{2}\, V_{BI\_RMS}}\right)\circ.$$

6. The device of claim 5, wherein the safety level voltage $V_{BRR\_DC}$ equals a breakdown voltage of the Zener diode.

7. The device of claim 1, wherein the triangle signal generator having a first charging current source unit and a first discharging current source unit; wherein
an input terminal of a voltage current converter and a switch of the first charging current source unit are controlled by a drive signal transmitted from the detection unit, thus the switch of the first charging current source unit is turned on when the detection voltage signal is at the second state, thus the first charging current source unit is used for charging the first capacitor; and
an input terminal of a voltage current converter and a switch in the first discharging current source unit are controlled by the drive signal transmitted from the detection unit, thus the switch of the first discharging current source unit is turned on when the detection voltage signal is at the first state, thus the first discharging current source unit is used for discharging the first capacitor.

8. The device of claim 7, wherein the detection voltage signal is inputted to a non inverting input terminal of a comparator in the detection unit and a threshold voltage is inputted to an inverting input terminal of the comparator;
when the detection voltage signal is greater than the threshold voltage, an output drive signal of the comparator is of the first state of high level turning on the switch of the first discharge current source unit; and
when the detection voltage signal is lower than the threshold voltage, the output drive signal of the comparator is of the second state of low level turning on the switch of the first charging current source unit.

9. The device of claim 8, wherein the output drive signal of the comparator of the detection unit and an inverting under voltage lockout signal are supplied simultaneously to two input terminals of an AND gate in the detection unit, and an output of the AND gate is transmitted to a control terminal of the switch of the first charging current source unit and to a control terminal of the switch of the first discharging current source unit; and
an anode of a diode is connected to the source of the junction field effect transistor and a cathode of the diode is connected to one end of a power supply capacitor, when a voltage of the capacitor is in under voltage state, the inverting under voltage lockout signal is low level thus clamping the drive signal delivered to switch of the first charging current source unit and to the switch of the first discharge current source units at a low level, interrupting the charging and discharging cycle of the first capacitor and the second capacitor.

10. The device of claim 3, wherein, at a falling edge each time the detection voltage signal changes from the first state to the second state the first and second capacitors discharge instantaneously before starting to charge immediately following the falling edge.

11. The device of claim 10, wherein a switch connected in parallel with the first capacitor and a switch connected in parallel with the second capacitor are controlled by an output signal of a monostable multivibrator of the detection unit;
the falling edge the detection voltage signal changing from the first state to the second state, or a rising edge of the falling edge inversion triggers the monostable multivibrator to transmit a high level output signal to turn on the switch connected in parallel to the first capacitor and the switch connected in parallel to the second capacitor, thus synchronously discharging the first capacitor and the second capacitor instantaneously.

12. The device of claim 7, wherein the reset signal generator comprises a second charging current source unit for charging the second capacitor, an input terminal of a voltage current converter of the second charging current source unit is coupled with the input terminal of the voltage current converter of the first charging current source unit, so as to charge the first capacitor and the second capacitor synchronously.

13. The device of claim 10, wherein the reset signal generator comprises a comparator, wherein an ungrounded end of the first capacitor is connected to an inverting input terminal of the comparator, an ungrounded end of the second capacitor is connected to a non inverting input terminal of the comparator, wherein a comparison result from the comparator is transmitted to a monostable multivibrator of the reset signal generator, and at every rising edge the comparison result changes from the second state to the first state, the monostable multivibrator is triggered to produce the first state reset signal.

14. The device of claim 13, wherein the comparison result from the comparator of the reset signal generator and an inverting under voltage lockout signal are supplied to an AND gate of the reset signal generator, an output of the AND gate is connected to an input of the monostable multivibrator of the reset signal generator and
   an anode of a diode is connected to the source of junction field-effect transistor and a cathode of the diode is connected to an end of a power supply capacitor, when the power supply capacitor is in under voltage condition, the inverting under voltage lockout signal is low level thus shielding the reset signal generator without generation of the first state reset signal.

15. The device of claim 3, wherein an output of the counter and an inverting signal of the comparison result are transmitted to two input terminals of an AND gate of the AC power removal and brown-out status determination unit, an output of the AND gate is sent to a set terminal of a first RS flip-flop of the AC power removal and brown-out status determination unit;
   the output of the counter and the comparison result are transmitted to two input terminals of another AND gate of the AC power removal and brown-out determination unit, an output of said another AND gate is sent to a set terminal of a second RS flip-flop of the AC power removal and brown-out status determination unit;
   when the output of the counter is at the first state, and the voltage of the first capacitor is not lower than the voltage of the second capacitor, the comparison result is of the second state, reset terminals of both the first RS flip-flop and second RS flip-flop are clamped at a low level, a Q output terminal of the first RS flip-flop generates an effective high level brown-out detection signal; or
   when the output of the counter is at the first state, and the voltage of the first capacitor is lower than the voltage of the second capacitor, the comparison result is of the first state, the reset terminals of both the first RS flip-flop and the second RS flip-flop are clamped at low level, a Q output terminal of the second RS flip-flop generates an effective high level power removal signal.

16. The device of claim 15, wherein an OR gate in the AC power removal and brown-out status determination unit receives an under voltage lockout signal and the reset signal simultaneously, an output signal of the OR gate is transmitted to the counter, and the reset terminals of the first RS flip-flop and the second RS flip-flops are connected to an output terminal of the OR gate;
   when the first RS flip-flop generates the high level brown-out detection signal or the second RS flip-flop generates the high level power removal signal, and the under voltage lockout signal is low level, the OR gate output is of low level without triggering the first RS flip-flop and the second RS flip-flop to reset.

17. The device of claim 2, further comprising a startup voltage detection module, wherein the varying voltage of the first capacitor is fed to an inverting input terminal of a comparator in the startup voltage detection module, a non inverting input terminal of the comparator is connected to ground, a detection result generated from the comparator is transmitted to a monostable multivibrator in the startup voltage detection module;
   a reference input voltage with a reference effective value $V_{INR}$ is fed to the detection unit, the breakdown voltage of the Zener diode is set as $V_Z$, a charging current of the first capacitor $I_1$ and a discharging current of the first capacitor $I_2$ satisfy $I_1 \times (1-D_B) = I_2 \times D_B$, within a cycle of the reference input voltage, a duty cycle $D_B$ of the detection voltage signal having a first state is as follows:

$$D_B = 1 - \frac{\sin^{-1}\left(\frac{V_Z}{\sqrt{2}\,V_{INR}}\right)}{90°};$$

when an effective value of actual input voltage is greater than the reference effective value of the reference input voltage, at each rising edge the detection result changes from the second state to the first state, the monostable multivibrator is triggered to output a startup voltage detection signal having the first state;
   when the actual input voltage is lower than the effective value of the reference, the detection results is always in the second state, hence in every cycle of the input voltage the monostable multivibrator continuously outputs voltage detection signals having the second state.

18. The device of claim 17, wherein the detection voltage signal is fed to a non inverting input of a comparator in the detection unit, the threshold voltage is fed to an inverting input terminal of the comparator in the detection unit; and
   in the startup voltage detection module, a switch is connected between an output terminal of the monostable multivibrator and ground, a control terminal of the switch receives an inverted drive signal output by the comparator in the detection unit;
   when the detection voltage signal is greater than the threshold voltage, a high level drive signal generated by the comparator in the detecting unit, after being inverted, turns off the switch of the startup voltage detection module, the startup voltage detection signal is solely triggered by the monostable multivibrator;
   when the detection voltage signal is lower than the threshold voltage, a low level drive signal generated by the comparator in the detection unit, after being inverted, turns on the switch of the startup voltage detection module, clamping the voltage detection signal at a low level.

19. The device of claim 17, wherein the detection result generated by the comparator and an inverting under voltage lockout signal are simultaneously transmitted to two inputs of an AND gate in the startup voltage detection module, thus an output signal of the AND gate is supplied to a T flip flop of the startup voltage detection module, and a Q output of the T flip flop is connected to an input terminal of the monostable multivibrator in the startup voltage detection module;
   when the inverting under voltage lockout signal is low level, the startup voltage detection module is shielded without generating the startup voltage detection signal of the first state.

20. The device of claim 17 further comprising an enable signal generator, wherein an output terminal of an AND gate is connected to a set terminal of a third RS flip-flop, while two inputs of the AND gate voltage receive the startup voltage detection signal and the inverting under voltage lockout signal respectively;
   an output terminal of another AND gate in the enable signal generator is connected to a reset terminal of the third RS flip-flop, while three input terminals of said another AND gate receive an inverting under voltage lockout signal, a signal from a Q output terminal of the third RS flip-flop and the brown-out detection signal respectively;

when the startup voltage detection signal and the inverting under voltage lockout signal are both of the first state, and either the brown-out signal or an initial state of the Q output signal of the third RS flip-flop is in the second state, the Q output terminal of the third RS flip-flop is triggered to transmit a high level effective enable signal;

when the brown-out detection signal, inverting under voltage lockout signal and the enable signal EN all are in the first state, and the startup voltage detection signal is in the second state, the Q output terminal of the third RS flip-flop is triggered to transmit a disable signal.

21. The device of claim 3, further comprising a logic control unit for maintaining a main switch connected between a control terminal of the junction field effect transistor and ground in ON state and turning off the main switch when receiving a high level power removal signal indicating AC power removal from the AC power removal and brown-out status determination unit.

22. The device of claim 21, wherein an anode of a diode is connected to the source of the junction field effect transistor and a cathode of the diode is connected to one end of a power supply capacitor, a voltage of the power supply capacitor is transmitted to an inverting input terminal of a first voltage detection comparator in the logic control unit; a non inverting input terminal of the first voltage detection comparator is fed with a first reference voltage, while an inverting under-voltage lockout signal obtained by inverting an under voltage lockout signal generated from the first voltage detection comparator is fed to a set terminal of a fourth RS flip-flop in the logic control unit; and the power removal signal and the under voltage lockout signal are fed to inputs of an OR gate in the logic control unit, an output of the OR gate is connected to a reset terminal of the fourth RS flip-flop;

in a initial stage, a voltage of a power supply capacitor is lower than the first reference voltage, the under voltage lockout signal is in the first state of high level, the power removal signal is of low level, hence a low level potential from a Q output terminal of the fourth RS flip-flop turns off the main switch, and begins charging the power supply capacitor until the voltage of the power supply capacitor is not lower than the first reference voltage, which changes the under voltage lockout signal to the second state of low level;

after that a control signal generated by the fourth RS flip-flop is maintained at high level solely by the power removal signal, only when the power removal signal is triggered to change to the first state of a high level, then the control signal generated by the fourth RS flip-flop will reset to a low level to disconnect the main switch.

23. The device of claim 22, wherein the voltage of the power supply capacitor is fed to an inverting input terminal of a second voltage detection comparator in the logic control unit and to a non inverting input terminal of a third voltage detector comparator in the logic control unit, a non inverting input terminal of the second voltage detection comparator is fed with a second reference voltage, an inverting input of the third voltage detection comparator is fed with a third reference voltage;

an output of the second voltage detection comparator and a latch signal are inputted to two input terminals of a NAND gate in the logic control unit, an output terminal of the NAND gate and the Q output terminal of the fourth RS flip-flop are connected to two input terminals of an AND gate in the logic control unit, an output of the AND gate is connected to a control terminal of the main switch;

an output of the third voltage detection comparator and the latch signal are fed to two inputs of another AND gate in the logic control unit, an output terminal of said another AND gate is connected to a control terminal of a regulating switch connected in parallel with the power supply capacitor;

before the voltage of the power supply capacitor reaches the second reference voltage, the latch signal is initially set to a low level, after the voltage of the power supply capacitor reaches the second reference voltage, the latch signal is set to high, thereby the voltage of the power supply capacitor is confined between the second reference voltage and third reference voltage.

24. A method of detecting input voltages and discharging the residue voltages comprising the steps of:

providing a detection unit to receive a DC input voltage rectified from an AC power, and according to fluctuations of the input voltage, generating a voltage detection signal with different logic states;

providing a triangle signal generator having a first capacitor, in any one cycle of the input voltage, when the detection voltage signal changes from a first state to a second state the first capacitor begins to charge, and in a following consecutive cycle of said any one cycle at a moment the detection voltage signal changes from the second state to the first state, the first capacitor begins to discharge;

providing a reset signal generator comprising a second capacitor, charging the second capacitor synchronously with the first capacitor and discharging the second capacitor in the following consecutive cycle when the voltage detection signal changes from the first state to the second state, comparing a varying voltage of the first capacitor and a varying voltage of the second capacitor, and according to a comparison result triggering the generation of a reset signal;

providing an AC power removal and brown-out status determination unit comprising a counter, within a preset period when the counter does not receive a first state reset signal and the voltage of the first capacitor is not lower than the voltage of the second capacitor, a low level detection signal indicating the input voltage at brown-out state is generated, and within the preset period when the voltage of the first capacitor is lower than the voltage of the second capacitor, a power removal signal indicating the AC power removal is generated.

25. The method of claim 24, wherein an anode of a Zener diode in the detection unit is connected to a drain of a junction field effect transistor in the detection unit, and the input voltage is applied to a cathode of the Zener diode, thereby generating detection voltage signal at the source of the junction field effect transistor.

26. The method of claim 25, wherein when the input voltage exceeds a breakdown voltage of the Zener diode, the voltage detection signal generated by the detection unit is the first state of high level, and when the input voltage is lower than the breakdown voltage of the Zener diode, the voltage detection signal generated by the detection unit is the second state of low level.

27. The method of claim 25, wherein the AC power supply is rectified by a rectifier circuit to provide the DC input, a high frequency filter capacitor is connected between two input terminals of the rectifier circuit; wherein a switch in a discharge branch is connected between the source of the junction field effect transistor and ground, during AC power removal, an effective high level power removal signal turns on the switch in the discharge branch, thus discharging the residue voltage on the high-frequency filter capacitor.

28. The method of claim 25, wherein, during AC power removal, a residue voltage of the AC power is discharged to a set safety level voltage $V_{BRR\_DC}$,
an effective value of input voltage at brown-out state as $V_{BO\_RMS}$,
the duty cycle of the detection voltage signal in the first state when input voltage is in brown-out state as $D_{BO}$,
an effective value of input voltage at startup as $V_{BI\_RMS}$,
the duty cycle of the detection voltage signal in the first state when input voltage is in startup state as $D_{BI}$;
after the first and the second capacitors complete charging synchronously for a same time period, a maximum voltage reached by the second capacitor $V_{CLM}$, and a maximum voltage reached by the first capacitor $V_{CTM}$, satisfy the following equation:

$$\frac{V_{CLM}}{V_{CTM}} = 1 - \frac{1}{\left(\frac{D_{BI}}{1-D_{BI}}\right) \cdot \left(\frac{1}{D_{BO}} - 1\right)}$$

where $$D_{BO} = 1 - \frac{1}{90}\sin^{-1}\left(\frac{V_{BRR\_DC}}{\sqrt{2}\,V_{BO\_RMS}}\right),$$

and $$D_{BI} = 1 - \frac{1}{90}\sin^{-1}\left(\frac{V_{BRR\_DC}}{\sqrt{2}\,V_{BI\_RMS}}\right).$$

29. The method of claim 28, wherein the safety level voltage $V_{BRR\_DC}$ equals to a breakdown voltage of the Zener diode.

30. The method of claim 24, wherein the triangle signal generator comprises a first charging current source unit and a first discharging current source unit, wherein
an input terminal of the voltage current converter and a switch of the first charging current source unit are controlled by a drive signal transmitted by the detection unit, when the detection voltage signal is of the second state the switch of the first charging current source unit is turned on, thus the first charging current source unit is used to charge the first capacitor; and
an input terminal of a voltage current converter and a switch of the first discharging current source unit are controlled by the drive signal transmitted by the detection unit, when the detection voltage signal is of the first state the switch of the first discharging current source unit is turned on, thus the first discharging current source unit is used to discharge the first capacitor.

31. The method of claim 30, wherein the detection voltage signal is fed to a non inverting input terminal of a comparator in the detection unit, while an inverting input terminal of the comparator is fed with a threshold voltage;
when the detection voltage signal is greater than the threshold voltage, a drive signal generated by the comparator in the detection unit is in the first state of high level thus turns on the switch of the first discharging current source unit;

when the detection voltage signal is lower than the threshold voltage, the drive signal generated by the comparator in the detection unit is in the second state of low level, thus turns on the switch of the first charging current source unit.

32. The method of claim 31, wherein the drive signal generated by the comparator in the detection unit and an inverting under voltage lockout signal are simultaneously fed to two input terminals of an AND gate in the detection unit, and the output terminal of the AND gate is connected to a control terminal of a respective switch in the first charging current source unit and the first discharging current source unit; and
an anode of a diode is connected to the source of the junction field effect transistor and the cathode of the diode is connected to one end of the power supply capacitor, when a voltage on the power supply capacitor is in brown-out condition, the inverting under voltage lockout signal is low level, clamping the drive signal transmitted to the respective switch of the first charging current source unit and the first discharge current source units at a low level, interrupting the charging and discharging cycle of the first and the second capacitors.

33. The method of claim 26, wherein at a falling edge each time the detection voltage signal changes from the first state to the second state, the first and the second capacitors instantaneously discharge before starting to charge immediately following the falling edge.

34. The method of claim 33, further providing a switch connected in parallel with the first capacitor and a switch connected in parallel with the second capacitor to be controlled by an output signal of a monostable multivibrator in the detecting unit;
the falling edge the detection voltage signal changing from the first state to the second state, or a rising edge of the falling edge inversion triggers the monostable multivibrator to transmit an output signal of high level to turn on the switch connected in parallel with the first capacitor and the switch connected in parallel with the second capacitor, thus the first and the second capacitors are synchronously discharged instantaneously.

35. The method of claim 30, wherein the reset signal generator comprises a second charging current source unit for charging the second capacitor, wherein an input terminal of a voltage-current converter of the second charging current source unit and the input terminal of the voltage current converter of the first charging current source unit are coupled together to synchronously charge the first and second capacitors.

36. The method of claim 33, wherein the reset signal generator comprises a comparator with an inverting input terminal of the comparator connected to an ungrounded end of the first capacitor and a non inverting input terminal of the comparator connected to an ungrounded end of the second capacitor, wherein a comparison result from the comparator is sent to a monostable multivibrator in the reset signal generator, and at every rising edge the comparison result changes from the second state to the first state, the monostable multivibrator is triggered to send out the first state reset signal.

37. The method of claim 36, wherein the comparison result from the comparator of the reset signal generator and an inverting under voltage lockout signal are transmitted simultaneously to an AND gate of the reset signal generator, where an output terminal of the AND gate is connected to an input terminal of the monostable multivibrator; and an anode of a diode is connected to the source of the junction field-effect transistor, and a cathode of the diode is connected to one end of a power supply capacitor, when a voltage on the power supply capacitor is in brown-out condition, the inverting under voltage lockout signal is low level, thus shielding the reset signal generator without generation of the first state reset signal.

38. The method of claim 26, wherein an output signal of the counter and an inverting signal of the comparison result from the comparator of the reset signal generator are fed to two input terminals of an AND gate in the AC power removal and brown-out status determination unit, and an output terminal of the AND gate is connected to a set terminal of a first RS flip-flop in the AC power removal and brown-out status determination unit; and the output signal of the counter and the comparison result from the comparator of the reset signal generator are fed to two input terminals of another AND gate in the AC power removal and brown-out status determination unit, and an output terminal of said another AND gate is connected to a set terminal of a second RS flip-flop in the AC power removal and brown-out status determination unit;

when the output signal of the counter is in the first state, and the voltage of the first capacitor is not lower than the voltage of the second capacitor, the comparison result from the comparator of the reset signal generator is of the second state, reset terminals of the first and the second RS flip-flop are clamped at a low level, thus a Q output terminal of the first RS flip-flop outputs an effective high level brown-out detection signal; or when the output of the counter is in the first state, and the voltage of the first capacitor is lower than the voltage of the second capacitor, the comparison result from the comparator of the reset signal generator is of the first state, the reset terminals of the first and the second RS flip-flop are clamped at a low level, thus a Q output terminal of the second RS flip-flop outputs an effective high level power removal signal.

39. The method of claim 38, wherein an OR gate in the AC power removal and brown-out status determination unit simultaneously receives an under voltage lockout signal and the reset signal generated from the reset signal generator, and an output signal of the OR gate is transmitted to the counter and the reset terminals of the first and the second RS flip-flops;

when the first RS flip-flop generates the high level brown-out detection signal or the second RS flip-flop generates the high level power removal signal, and while the under voltage lockout signal is low level, the OR gate is of low level without triggering the first and the second RS flip-flop to reset.

40. The method of claim 25, further comprising providing a startup voltage detection module, wherein the varying voltage of the first capacitor is inputted to an inverting input terminal of a comparator of the startup voltage detection module, while a non inverting input of the comparator is grounded, wherein a detection result generated from the comparator is transmitted to a monostable multivibrator of the startup voltage detection module;

a reference input voltage having a reference effective value $V_{INR}$ is fed to the detection unit;

setting the breakdown voltage of Zener diode as $V_Z$, a charging current of the first capacitor $I_1$ and a discharging current of the first capacitor $I_2$ satisfy:

$I_1 \times (1-D_B) = I_2 \times D_B$ within a cycle of the reference input voltage, where a duty cycle $D_B$ of the detection voltage signal having a first state is as follows:

$$D_B = 1 - \frac{\sin^{-1}\left(\frac{V_Z}{\sqrt{2} V_{INR}}\right)}{90°}$$

when an effective value of actual input voltage is greater than the reference effective value of the reference input voltage, at each rising edge the detection result changes from the second state to the first state, the monostable multivibrator is triggered to generate a startup voltage detection signal of the first state;

when the effective value of actual input voltage is lower than the reference effective value of the reference input voltage, the detection result is always in the second state, the monostable multivibrator continuously generates a startup voltage detection signal of the second state in every cycle of the input voltage.

41. The method of claim 40, wherein a detection voltage signal is fed to a non inverting input terminal of a comparator in the detection unit, while a threshold voltage is fed to an inverting input terminal of the comparator; and a switch is connected between an output terminal of the monostable multivibrator in the startup voltage detection module and ground, a control terminal of the switch receives an inverted drive signal generated by the comparator in the detect unit;

when the detection voltage signal is greater than the threshold voltage, a high level drive signal generated by the comparator in the detection unit, after inverted, turns off the switch in the startup voltage detection module, as such the startup voltage detection signal is solely triggered by the monostable multivibrator in the startup voltage detection module;

when the detection voltage signal is lower than the threshold voltage, the low level drive signal generated by the comparator in the detection unit, after inverted, turns on the switch in the startup voltage detection module, clamping the startup voltage detection signal at a low level.

42. The method of claim 40, wherein the detection result generated by the comparator in the startup voltage detection module and an inverting under voltage lockout signal are simultaneously transmitted to two inputs of an AND gate in the startup voltage detection module, then an output signal of the AND gate is transmitted to a T flip flop in the startup voltage detection module, and a Q output terminal of the T flip-flop is connected to an input terminal of the monostable multivibrator in the startup voltage detection module;

when the inverting under voltage lockout signal is low, the startup voltage detection module is shielded without generating the startup voltage detection signal of the first state.

43. The method of claim 40, further providing an enable signal generator comprising an AND gate, wherein two input terminals of the AND gate receives the startup voltage detection signal and the inverting under voltage lockout signal, while an output terminal of the AND gate is connected to a set terminal of a third RS flip-flop in the enable signal generator;

wherein the enable signal generator comprises another AND gate, three input terminals of said another AND gate receive an inverting under voltage lockout signal, a Q output signal of the third RS flip-flop and the brown-out voltage detection signal, while an output terminal of said another AND gate is connected to a reset terminal of the third RS flip-flop;

when the startup voltage detection signal and the inverting under voltage lockout signal are both of the first state, and when either the brown-out detection signal or an initial Q output signal of the third RS flip-flop is of the second state, the Q output terminal of the third RS flip-flop is triggered to transmit an effective enable signal of high level;

when the brown-out detection signal, the inverting under voltage lockout signal and the enable signal are all in the first state, and the startup voltage detection signal is in the second state, the Q output terminal of the third RS flip-flop is triggered to transmit a disable signal.

44. The method of claim 26, further comprising a step of providing a logic control unit, wherein the logic control unit maintains a main switch connected between a control terminal of the junction field effect transistor and ground in ON state, and turns off the main switch when receiving a high level power removal signal indicating AC power removal from the AC power removal and brown-out status determination unit.

45. The method of claim 44, wherein an anode of a diode is connected to the source of the junction field effect transistor and a cathode of the diode is connected to one end of a power supply capacitor, wherein a voltage of the power supply capacitor is fed to an inverting input terminal of a first voltage detection comparator in the logic control unit and a first reference voltage is fed to a non-inverting input terminal of the first voltage detection comparator, and wherein an inverting under voltage lockout signal obtained by inverting an under voltage lockout signal generated by the first voltage detection comparator is sent to a set terminal of a fourth RS flip-flop in the logic control unit; and the power removal signal and the under voltage lockout signal are transmitted to inputs of an OR gate in the logic control unit, and an output terminal of the OR gate is connected to a reset terminal of the fourth RS flip-flop;

during startup a voltage of the power supply capacitor is lower than the first reference voltage, the inverting under voltage lockout signal is in the first state of high level, the power removal signal is low level, hence a low level output signal generated from a Q output terminal of the fourth RS flip-flop turns off the main switch and thus the power supply capacitor begins to charge until the voltage of the power supply capacitor is not lower than the first reference voltage, which then causes the under voltage lockout signal to change to the second state of low level; thereafter a control signal generated by the fourth RS flip-flop is maintained at the high level solely by the power removal signal, unless the power removal signal is triggered to be at the first state of a high level which will reset the control signal produced from the fourth RS flip-flop to a low level, disconnecting the main switch.

46. The method of claim 45, wherein the voltage of the power supply capacitor is sent to an inverting input terminal of a second voltage detection comparator in logic control unit and to a non inverting input terminal of a third voltage detector comparator in the logic control unit, while a second reference voltage is sent to a non inverting input terminal of the second voltage detection comparator in the logic control unit, and a third reference voltage is sent to an inverting input terminal of the third voltage detection comparator;

an output signal of the second voltage detection comparator and a latch signal are fed to two input terminals of an NAND gate in the logic control unit, an output terminal of the NAND gate and the Q output terminal of the fourth RS flip-flop are connected to two input terminals of an AND gate in the logic control unit, an output of the AND gate is connected to a control terminal of the main switch;

an output of the third voltage detector comparator and the latch signal are inputted to two inputs of another AND gate in the logic control unit, an output of said another AND gate is connected to a control terminal of a regulating switch connected in parallel with the power supply capacitor; and before the voltage of the power supply capacitor reaches the second reference voltage, the latch signal is initially set to a low level, after the voltage of the power supply capacitor reaches the second reference voltage, the latch signal is set to a high level, thereby confining the voltage of the power supply capacitor between the second reference voltage and third reference voltage.

* * * * *